(12) United States Patent
Yang et al.

(10) Patent No.: US 9,923,666 B2
(45) Date of Patent: Mar. 20, 2018

(54) ENCODING IN UPLINK MULTI-USER MIMO AND OFDMA TRANSMISSIONS

(71) Applicant: QUALCOMM Incorporated, San Diego, CA (US)

(72) Inventors: Lin Yang, San Diego, CA (US); Bin Tian, San Diego, CA (US); Gang Ding, San Diego, CA (US); Youhan Kim, San Jose, CA (US); Sameer Vermani, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 105 days.

(21) Appl. No.: 14/871,892

(22) Filed: Sep. 30, 2015

(65) Prior Publication Data

US 2016/0099796 A1 Apr. 7, 2016

Related U.S. Application Data

(60) Provisional application No. 62/058,620, filed on Oct. 1, 2014.

(51) Int. Cl.
*H03M 13/00* (2006.01)
*H04L 1/00* (2006.01)
(Continued)

(52) U.S. Cl.
CPC ....... *H04L 1/0041* (2013.01); *H03M 13/1177* (2013.01); *H03M 13/235* (2013.01); *H04B 7/0456* (2013.01); *H04L 1/0045* (2013.01); *H04L 1/0057* (2013.01); *H04L 1/0059* (2013.01); *H04L 1/0075* (2013.01);
(Continued)

(58) Field of Classification Search
CPC ............ H03M 13/1177; H03M 13/235; H04L 1/0041; H04L 1/0057; H04L 1/0059; H04L 1/0625; H04B 7/0456
See application file for complete search history.

(56) References Cited

U.S. PATENT DOCUMENTS

| | | | | |
|---|---|---|---|---|
| 7,420,915 B2 * | 9/2008 | Murakami | ............. | H04B 1/692 |
| | | | | 370/204 |
| 7,664,011 B2 * | 2/2010 | Murakami | ............. | H04B 1/692 |
| | | | | 370/208 |

(Continued)

OTHER PUBLICATIONS

International Search Report and Written Opinion—PCT/US2015/053515—ISA/EPO—dated Jan. 8, 2016.

(Continued)

*Primary Examiner* — Esaw Abraham
(74) *Attorney, Agent, or Firm* — Arent Fox LLP

(57) ABSTRACT

A method, an apparatus, and a computer-readable medium for wireless communication are provided. In one aspect, the apparatus is configured to determine a number of data symbols for transmitting a data payload. The apparatus is configured to determine a number of payload bits for transmitting the data payload based on the determined number of data symbols. The apparatus is configured to transmit a data frame. The data frame includes a signal field and data symbols encoded based on the data payload, the determined number of data symbols, and the determined number of payload bits, in which the data symbols are encoded using LDPC encoding or BCC encoding.

16 Claims, 9 Drawing Sheets

(51) Int. Cl.
*H03M 13/11* (2006.01)
*H03M 13/23* (2006.01)
*H04B 7/0456* (2017.01)
*H04L 27/12* (2006.01)
*H04L 1/06* (2006.01)
*H04B 7/0452* (2017.01)
*H04B 7/06* (2006.01)

(52) U.S. Cl.
CPC ............ *H04L 1/0625* (2013.01); *H04L 27/12* (2013.01); *H04B 7/0452* (2013.01); *H04B 7/0669* (2013.01)

(56) References Cited

U.S. PATENT DOCUMENTS

| | | | | |
|---|---|---|---|---|
| 7,668,248 | B2* | 2/2010 | Hocevar | H03M 13/1185 |
| | | | | 375/260 |
| 8,369,303 | B2* | 2/2013 | Gong | H04B 7/0452 |
| | | | | 370/345 |
| 8,665,811 | B2* | 3/2014 | Nory | H04L 25/0228 |
| | | | | 370/329 |
| 8,665,906 | B1* | 3/2014 | Liu | H04B 7/0617 |
| | | | | 370/349 |
| 8,761,285 | B2* | 6/2014 | Addepalli | H04L 27/345 |
| | | | | 375/261 |
| 8,982,792 | B2* | 3/2015 | Liu | H04W 8/26 |
| | | | | 370/328 |
| 9,077,569 | B2* | 7/2015 | Nory | H04L 25/0228 |
| 9,083,590 | B2* | 7/2015 | Liu | H04W 8/26 |
| 9,106,376 | B2* | 8/2015 | Hwang | H04L 1/004 |
| 9,191,051 | B1* | 11/2015 | Narasimhan | H04B 7/0447 |
| 9,585,043 | B2* | 2/2017 | Grandhi | H04W 4/06 |
| 2012/0069830 | A1 | 3/2012 | Shi et al. | |
| 2012/0106575 | A1 | 5/2012 | Oh et al. | |
| 2013/0301551 | A1 | 11/2013 | Ghosh et al. | |

OTHER PUBLICATIONS

Seok Y, (NEWRACOM) : "HEW PPDU Format for Supporting MIMO-OFDMA ; 11-14-1210-01-00ax-hew-ppdu-format-for-sup porting-mimo-ofdma," IEEE Draft; 11-14-1210-01-00ax-Hew-Ppdu-Format-For-Sup Porting-Mimo-Ofdma, IEEE-Sa Mentor, Piscataway, NJ USA, vol. 802.11ax, No. 1, Sep. 16, 2014.

Stacey R, (INTEL) : "Proposed Specification Framework for TGac . 11-09-0992-21-00ac-proposed-specificationframework-for-tgac," IEEE Sa Mentor; 11-09-0992-21-00AC-Proposed-Specifica-tion-Framework-For-TGAC, IEEE-Sa Mentor. Piscataway. NJ USA, vol. 802.11ac. No. 21. Jan. 19, 2011.

Zhang H, (MARVELL) : "11ah Padding ; 11-12-0818-00-00ah-llah-padding," IEEE Sa Mentor; 11-12-0818-00-00AH-11ah-Padding, IEEE-Sa Mentor, Piscataway, NJ USA, vol. 802.11ah, Jul. 16, 2012 (Jul. 16, 2012), pp. 1-11, XP068039337.

* cited by examiner

US 9,923,666 B2

ENCODING IN UPLINK MULTI-USER MIMO AND OFDMA TRANSMISSIONS

CROSS-REFERENCE TO RELATED APPLICATION(S)

This application claims the benefit of U.S. Provisional Application Ser. No. 62/058,620, entitled "LDPC Encoding in Uplink Multi-User and OFDMA" and filed on Oct. 1, 2014, which is expressly incorporated by reference herein in its entirety.

BACKGROUND

Field

The present disclosure relates generally to communication systems, and more particularly, to encoding (e.g., low density parity check (LDPC) or binary convolution code (BCC) encoding) in uplink multi-user multi-input-multi-output (MIMO) and orthogonal frequency-division multiple access (OFDMA) communications.

Background

In many telecommunication systems, communications networks are used to exchange messages among several interacting spatially-separated devices. Networks may be classified according to geographic scope, which could be, for example, a metropolitan area, a local area, or a personal area. Such networks would be designated respectively as a wide area network (WAN), metropolitan area network (MAN), local area network (LAN), wireless local area network (WLAN), or personal area network (PAN). Networks also differ according to the switching/routing technique used to interconnect the various network nodes and devices (e.g., circuit switching vs. packet switching), the type of physical media employed for transmission (e.g., wired vs. wireless), and the set of communication protocols used (e.g., Internet protocol suite, Synchronous Optical Networking (SONET), Ethernet, etc.).

Wireless networks are often preferred when the network elements are mobile and thus have dynamic connectivity needs, or if the network architecture is formed in an ad hoc, rather than fixed, topology. Wireless networks employ intangible physical media in an unguided propagation mode using electromagnetic waves in the radio, microwave, infra-red, optical, etc., frequency bands. Wireless networks advantageously facilitate user mobility and rapid field deployment when compared to fixed wired networks.

SUMMARY

The systems, methods, computer program products, and devices of the invention each have several aspects, no single one of which is solely responsible for the invention's desirable attributes. Without limiting the scope of this invention as expressed by the claims which follow, some features will now be discussed briefly. After considering this discussion, and particularly after reading the section entitled "Detailed Description," one will understand how the features of this invention provide advantages for devices in a wireless network.

One aspect of this disclosure provides an apparatus (e.g., a station) for wireless communication. The apparatus is configured to determine a number of data symbols for transmitting a data payload. The apparatus is configured to determine a number of payload bits for transmitting the data payload based on the determined number of data symbols. The apparatus is configured to transmit a data frame, in which the data frame includes a signal field and data symbols encoded based on the data payload, the determined number of data symbols, and the determined number of payload bits. The data symbols are encoded using LDPC encoding or BCC encoding.

In another aspect, an apparatus for wireless communication is provided. The apparatus includes means for determining a number of data symbols for transmitting a data payload. The apparatus includes means for determining a number of payload bits for transmitting the data payload based on the determined number of data symbols. The apparatus includes means for transmitting a data frame, in which the data frame includes a signal field and data symbols encoded based on the data payload, the determined number of data symbols, and the determined number of payload bits. The data symbols may be encoded using LDPC encoding or BCC encoding. In an aspect, the signal field includes at least one of a padding bit, a packet length, a space-time block code bit, or a modulation and coding scheme value. In another configuration, the apparatus may include means for encoding the data payload using LDPC encoding or BCC encoding for uplink MU-MIMO transmission or uplink OFDMA transmission to an access point. In another configuration, the apparatus may include means for receiving a trigger message, and the trigger message may include a mandatory time duration for the data frame. In another configuration, the apparatus may be associated with a space-time block code value, and the apparatus may include means for determining a second number of data symbols for transmitting the data payload based on the mandatory time duration for the data frame. In this configuration, the number of data symbols for transmitting the data payload may be based on a difference between the determined second number of data symbols and the space-time block code value, the data symbols are padded to fill the determined number of data symbols for transmitting the data payload and include a third number of data symbols determined based on the space-time block code value, and the signal field may include a space-time block code bit and a modulation and coding scheme value. In another configuration, the apparatus may be associated with a space-time block code value and a padding bit, and the apparatus may include means for determining a second number of data symbols for transmitting the data payload based on the mandatory time duration for the data frame, the number of data symbols for transmitting the data payload may be based a difference between the determined second number of data symbols and a product of the space-time block code value and the padding bit, the data symbols may be padded to fill the determined number of data symbols for transmitting the data payload and include a third number of data symbols determined based on the product of the space-time block code value and the padding bit, and the signal field may include a space-time block code bit, a modulation and coding scheme value, and the padding bit. In another configuration, the apparatus may include means for receiving a trigger message. In this configuration, the trigger message may include at least one of a mandatory time duration for the data frame, an MCS value for the data frame, a space-time block code bit, or a data packet length value, and the data symbols may be encoded using BCC encoding. In another configuration, the trigger message may include the mandatory time duration for the data frame and the apparatus may be associated with a space-time block code value. In this configuration, the number of data symbols for transmitting the data payload may be based on the mandatory time duration, the data symbols may be padded to fill the determined number of data symbols for transmitting the data payload and may include a set of tail bits, and the signal field may include a space-time block code bit associated with the space-time block code value and the MCS value. In another configuration, the trigger message may include the mandatory time duration for the data frame, the MCS value, and the space-time block code bit, the apparatus may be associated with a space-time block code value determined based on the space-time block code bit, the number of data symbols for transmitting the data payload may be based on the mandatory time duration, and the data symbols may be padded to fill the determined number of data symbols for transmitting the data payload and include a set of tail bits. In another configuration, the trigger message may include the mandatory time duration for the data frame, the MCS value, the space-time block code bit, and the data packet length value, the number of data symbols for transmitting the data payload may be equal to the data packet length value, and the data symbols may be padded to fill the determined number of data symbols for transmitting the data payload and include a set of tail bits. In another configuration, the trigger message may include the mandatory time duration for the data frame, the MCS value, the space-time block code bit, and the data packet length value, the data packet length value may be based on a maximum symbol requirement for a plurality of stations and a maximum space-time block code value for the plurality of stations, the determined number of data symbols for transmitting the data payload may be equal to the data packet length value, and the data symbols may be padded to fill the determined number of data symbols for transmitting the data payload and include a set of tail bits.

In another aspect, a computer-readable medium storing executable code for wireless communication by a station is provided. The computer-readable medium includes code for determining a number of data symbols for transmitting a data payload. The computer-readable medium includes code for determining a number of payload bits for transmitting the data payload based on the determined number of data symbols. The computer-readable medium includes code for transmitting a data frame, in which the data frame includes a signal field and data symbols encoded based on the data payload, the determined number of data symbols, and the determined number of payload bits. The data symbols may be encoded using LDPC encoding or BCC encoding. In an aspect, the signal field includes at least one of a padding bit, a packet length, a space-time block code bit, or a modulation and coding scheme value. In another configuration, the computer-readable medium may include code for encoding the data payload using LDPC encoding or BCC encoding for uplink MU-MIMO transmission or uplink OFDMA transmission to an access point. In another configuration, the computer-readable medium may include code for receiving a trigger message, and the trigger message may include a mandatory time duration for the data frame. In another configuration, the station may be associated with a space-time block code value, and the computer-readable medium may include code for determining a second number of data symbols for transmitting the data payload based on the mandatory time duration for the data frame. In this configuration, the number of data symbols for transmitting the data payload may be based on a difference between the determined second number of data symbols and the space-time block code value, the data symbols are padded to fill the determined number of data symbols for transmitting the data payload and include a third number of data symbols determined based on the space-time block code value, and the signal field may include a space-time block code bit and a modulation and coding scheme value. In another configuration, the station may be associated with a space-time block code value and a padding bit, and the computer-readable medium may include code for determining a second number of data symbols for transmitting the data payload based on the mandatory time duration for the data frame, the number of data symbols for transmitting the data payload may be based a difference between the determined second number of data symbols and a product of the space-time block code value and the padding bit, the data symbols may be padded to fill the determined number of data symbols for transmitting the data payload and include a third number of data symbols determined based on the product of the space-time block code value and the padding bit, and the signal field may include a space-time block code bit, a modulation and coding scheme value, and the padding bit. In another configuration, the computer-readable medium may include code for receiving a trigger message. In this configuration, the trigger message may include at least one of a mandatory time duration for the data frame, an MCS value for the data frame, a space-time block code bit, or a data packet length value, and the data symbols may be encoded using BCC encoding. In another configuration, the trigger message may include the mandatory time duration for the data frame and the station may be associated with a space-time block code value. In this configuration, the number of data symbols for transmitting the data payload may be based on the mandatory time duration, the data symbols may be padded to fill the determined number of data symbols for transmitting the data payload and may include a set of tail bits, and the signal field may include a space-time block code bit associated with the space-time block code value and the MCS value. In another configuration, the trigger message may include the mandatory time duration for the data frame, the MCS value, and the space-time block code bit, the station may be associated with a space-time block code value determined based on the space-time block code bit, the number of data symbols for transmitting the data payload may be based on the mandatory time duration, and the data symbols may be padded to fill the determined number of data symbols for transmitting the data payload and include a set of tail bits. In another configuration, the trigger message may include the mandatory time duration for the data frame, the MCS value, the space-time block code bit, and the data packet length value, the number of data symbols for transmitting the data payload may be equal to the data packet length value, and the data symbols may be padded to fill the determined number of data symbols for transmitting the data payload and include a set of tail bits. In another configuration, the trigger message may include the mandatory time duration for the data frame, the MCS value, the space-time block code bit, and the data packet length value, the data packet length value may be based on a maximum symbol requirement for a plurality of stations and a maximum space-time block code value for the plurality of stations, the determined number of data symbols for transmitting the data payload may be equal to the data packet length value, and the data symbols may be padded to fill the determined number of data symbols for transmitting the data payload and include a set of tail bits.

Another aspect of this disclosure provides an apparatus (e.g., an access point) for wireless communication. The apparatus of the access point is configured to receive a data frame, in which the data frame includes a signal field and a plurality of data symbols. The apparatus is configured to determine a number of data symbols in the received data frame and to determine a number of payload bits based on the determined number of data symbols.

In another aspect, an apparatus for wireless communication is provided. The apparatus may be an access point. The apparatus includes means for receiving a data frame from a station, and the data frame may include a signal field and a plurality of data symbols encoded, using LDPC encoding or BCC encoding, for uplink MU-MIMO transmission or uplink OFDMA transmission. The apparatus includes means for decoding the data frame that includes the plurality of data symbols encoded based on LDPC encoding or BCC encoding. In one configuration, the means for decoding the data frame may be configured to determine a number of data symbols in the received data frame and to determine a number of payload bits based on the determined number of data symbols. In this configuration, the plurality of data symbols may be decoded based on the determined number of data symbols and the determined number of payload bits. In another configuration, the signal field includes at least one of a padding bit, a data packet length value, a space-time block code bit, or an MCS value. In another configuration, the apparatus may include means for transmitting a trigger message, and the trigger message may include at least one of a mandatory time duration for the data frame, an MCS value for the data frame, a space-time block code bit, or a padding bit.

In an aspect, a computer-readable medium storing executable code for wireless communication by an access point is provided. The computer-readable medium may include code for receiving a data frame from a station, and the data frame may include a signal field and a plurality of data symbols encoded, using LDPC encoding or BCC encoding, for uplink MU-MIMO transmission or uplink OFDMA transmission. The computer-readable medium may include code for decoding the data frame that includes the plurality of data symbols encoded based on LDPC encoding or BCC encoding. In one configuration, the code for decoding the data frame may include code for determining a number of data symbols in the received data frame and for determining a number of payload bits based on the determined number of data symbols. In this configuration, the plurality of data symbols may be decoded based on the determined number of data symbols and the determined number of payload bits. In another configuration, the signal field includes at least one of a padding bit, a data packet length value, a space-time block code bit, or an MCS value. In another configuration, the computer-readable medium may include code for transmitting a trigger message, and the trigger message may include at least one of a mandatory time duration for the data frame, an MCS value for the data frame, a space-time block code bit, or a padding bit.

DETAILED DESCRIPTION

Figure 1:
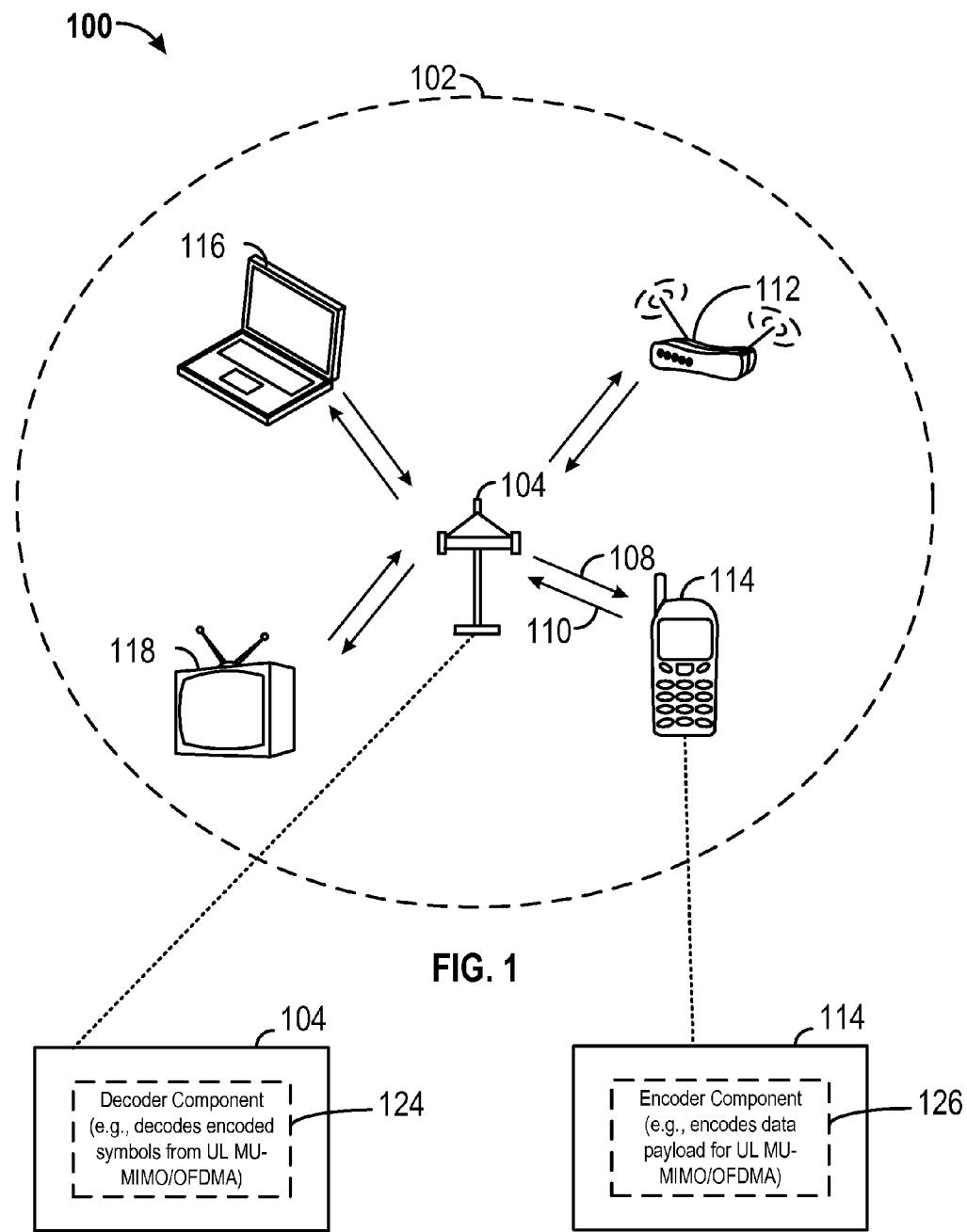
FIG. 1 shows an example wireless communication system in which aspects of the present disclosure may be employed.

Various aspects of the novel systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatuses, computer program products, and methods disclosed herein, whether implemented independently of, or combined with, any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Popular wireless network technologies may include various types of WLANs. A WLAN may be used to interconnect nearby devices together, employing widely used networking protocols. The various aspects described herein may apply to any communication standard, such as a wireless protocol.

In some aspects, wireless signals may be transmitted according to an 802.11 protocol using orthogonal frequency-division multiplexing (OFDM), direct-sequence spread spectrum (DSSS) communications, a combination of OFDM and DSSS communications, or other schemes. Implementations of the 802.11 protocol may be used for sensors, metering, and smart grid networks. Advantageously, aspects of certain devices implementing the 802.11 protocol may consume less power than devices implementing other wireless protocols, and/or may be used to transmit wireless signals across a relatively long range, for example about one kilometer or longer.

In some implementations, a WLAN includes various devices which are the components that access the wireless network. For example, there may be two types of devices: access points (APs) and clients (also referred to as stations or "STAs"). In general, an AP may serve as a hub or base station for the WLAN and a STA serves as a user of the WLAN. For example, a STA may be a laptop computer, a personal digital assistant (PDA), a mobile phone, etc. In an example, a STA connects to an AP via a Wi-Fi (e.g., IEEE 802.11 protocol) compliant wireless link to obtain general connectivity to the Internet or to other wide area networks. In some implementations a STA may also be used as an AP.

An access point may also comprise, be implemented as, or known as a NodeB, Radio Network Controller (RNC), eNodeB, Base Station Controller (BSC), Base Transceiver Station (BTS), Base Station (BS), Transceiver Function (TF), Radio Router, Radio Transceiver, connection point, or some other terminology.

A station may also comprise, be implemented as, or known as an access terminal (AT), a subscriber station, a subscriber unit, a mobile station, a remote station, a remote terminal, a user terminal, a user agent, a user device, a user equipment, or some other terminology. In some implementations, a station may comprise a cellular telephone, a cordless telephone, a Session Initiation Protocol (SIP) phone, a wireless local loop (WLL) station, a personal digital assistant (PDA), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

In an aspect, MIMO schemes may be used for wide area WLAN (e.g., Wi-Fi) connectivity. MIMO exploits a radiowave characteristic called multipath. In multipath, transmitted data may bounce off objects (e.g., walls, doors, furniture), reaching the receiving antenna multiple times through different routes and at different times. A WLAN device that employs MIMO will split a data stream into multiple parts, called spatial streams (or multi-streams), and transmit each spatial stream through separate antennas to corresponding antennas on a receiving WLAN device.

The term "associate," or "association," or any variant thereof should be given the broadest meaning possible within the context of the present disclosure. By way of example, when a first apparatus associates with a second apparatus, it should be understood that the two apparatuses may be directly associated or intermediate apparatuses may be present. For purposes of brevity, the process for establishing an association between two apparatuses will be described using a handshake protocol that requires an "association request" by one of the apparatus followed by an "association response" by the other apparatus. It will be understood by those skilled in the art that the handshake protocol may require other signaling, such as by way of example, signaling to provide authentication.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. In addition, a phrase referring to "at least one of" a list of items refers to any combination of those items, including single members. As an example, "at least one of: A, B, or C" is intended to cover: A, or B, or C, or any combination thereof (e.g., A-B, A-C, B-C, and A-B-C).

As discussed above, certain devices described herein may implement the 802.11 standard, for example. Such devices, whether used as a STA or AP or other device, may be used for smart metering or in a smart grid network. Such devices may provide sensor applications or be used in home automation. The devices may instead or in addition be used in a healthcare context, for example for personal healthcare. They may also be used for surveillance, to enable extended-range Internet connectivity (e.g. for use with hotspots), or to implement machine-to-machine communications.

FIG. 1 shows an example wireless communication system 100 in which aspects of the present disclosure may be employed. The wireless communication system 100 may operate pursuant to a wireless standard, for example the 802.11 standard. The wireless communication system 100 may include an AP 104, which communicates with STAs (e.g., STAs 112, 114, 116, and 118).

A variety of processes and methods may be used for transmissions in the wireless communication system 100 between the AP 104 and the STAs. For example, signals may be sent and received between the AP 104 and the STAs in accordance with OFDM/OFDMA techniques. If this is the case, the wireless communication system 100 may be referred to as an OFDM/OFDMA system. Alternatively, signals may be sent and received between the AP 104 and the STAs in accordance with CDMA techniques. If this is the case, the wireless communication system 100 may be referred to as a CDMA system.

A communication link that facilitates transmission from the AP 104 to one or more of the STAs may be referred to as a downlink (DL) 108, and a communication link that facilitates transmission from one or more of the STAs to the AP 104 may be referred to as an uplink (UL) 110. Alternatively, a downlink 108 may be referred to as a forward link or a forward channel, and an uplink 110 may be referred to as a reverse link or a reverse channel. In some aspects, DL communications may include unicast or multicast traffic indications.

The AP 104 may suppress adjacent channel interference (ACI) in some aspects so that the AP 104 may receive UL communications on more than one channel simultaneously without causing significant analog-to-digital conversion (ADC) clipping noise. The AP 104 may improve suppression of ACI, for example, by having separate finite impulse response (FIR) filters for each channel or having a longer ADC backoff period with increased bit widths.

The AP 104 may act as a base station and provide wireless communication coverage in a basic service area (BSA) 102. A BSA (e.g., the BSA 102) is the coverage area of an AP (e.g., the AP 104). The AP 104 along with the STAs associated with the AP 104 and that use the AP 104 for communication may be referred to as a basic service set (BSS). It should be noted that the wireless communication system 100 may not have a central AP (e.g., AP 104), but rather may function as a peer-to-peer network between the STAs. Accordingly, the functions of the AP 104 described herein may alternatively be performed by one or more of the STAs.

The AP 104 may transmit on one or more channels (e.g., multiple narrowband channels, each channel including a frequency bandwidth) a beacon signal (or simply a "beacon"), via a communication link such as the downlink 108, to other nodes (STAs) of the wireless communication system 100, which may help the other nodes (STAs) to synchronize their timing with the AP 104, or which may provide other information or functionality. Such beacons may be transmitted periodically. In one aspect, the period between successive transmissions may be referred to as a superframe. Transmission of a beacon may be divided into a number of groups or intervals. In one aspect, the beacon may include, but is not limited to, such information as timestamp information to set a common clock, a peer-to-peer network identifier, a device identifier, capability information, a superframe duration, transmission direction information, reception direction information, a neighbor list, and/or an extended neighbor list, some of which are described in additional detail below. Thus, a beacon may include information that is both common (e.g., shared) amongst several devices and specific to a given device.

In some aspects, a STA (e.g., STA 114) may be required to associate with the AP 104 in order to send communications to and/or to receive communications from the AP 104. In one aspect, information for associating is included in a beacon broadcast by the AP 104. To receive such a beacon, the STA 114 may, for example, perform a broad coverage search over a coverage region. A search may also be performed by the STA 114 by sweeping a coverage region in a lighthouse fashion, for example. After receiving the information for associating, the STA 114 may transmit a reference signal, such as an association probe or request, to the AP 104. In some aspects, the AP 104 may use backhaul services, for example, to communicate with a larger network, such as the Internet or a public switched telephone network (PSTN).

In an aspect, the AP 104 may include one or more components for performing various functions. For example, the AP 104 may include a decoder component 124 configured to receive a data frame, in which the data frame includes a signal field and a number of data symbols. The decoder component 124 may be configured to determine a number of data symbols in the received data frame and to determine a number of payload bits based on the determined number of data symbols.

In another aspect, the STA 114 may include one or more components for performing various functions. In one configuration, the STA 114 may include an encoder component 126 configured determine a number of data symbols for transmitting a data payload. The encoder component 126 may be configured to determine a number of payload bits for transmitting the data payload based on the determined number of data symbols. The encoder component 126 may be configured to transmit a data frame. The data frame may include a signal field and data symbols encoded based on the data payload, the determined number of data symbols, and the determined number of payload bits. The data symbols may be encoded using LDPC encoding or BCC encoding.

Figure 2:
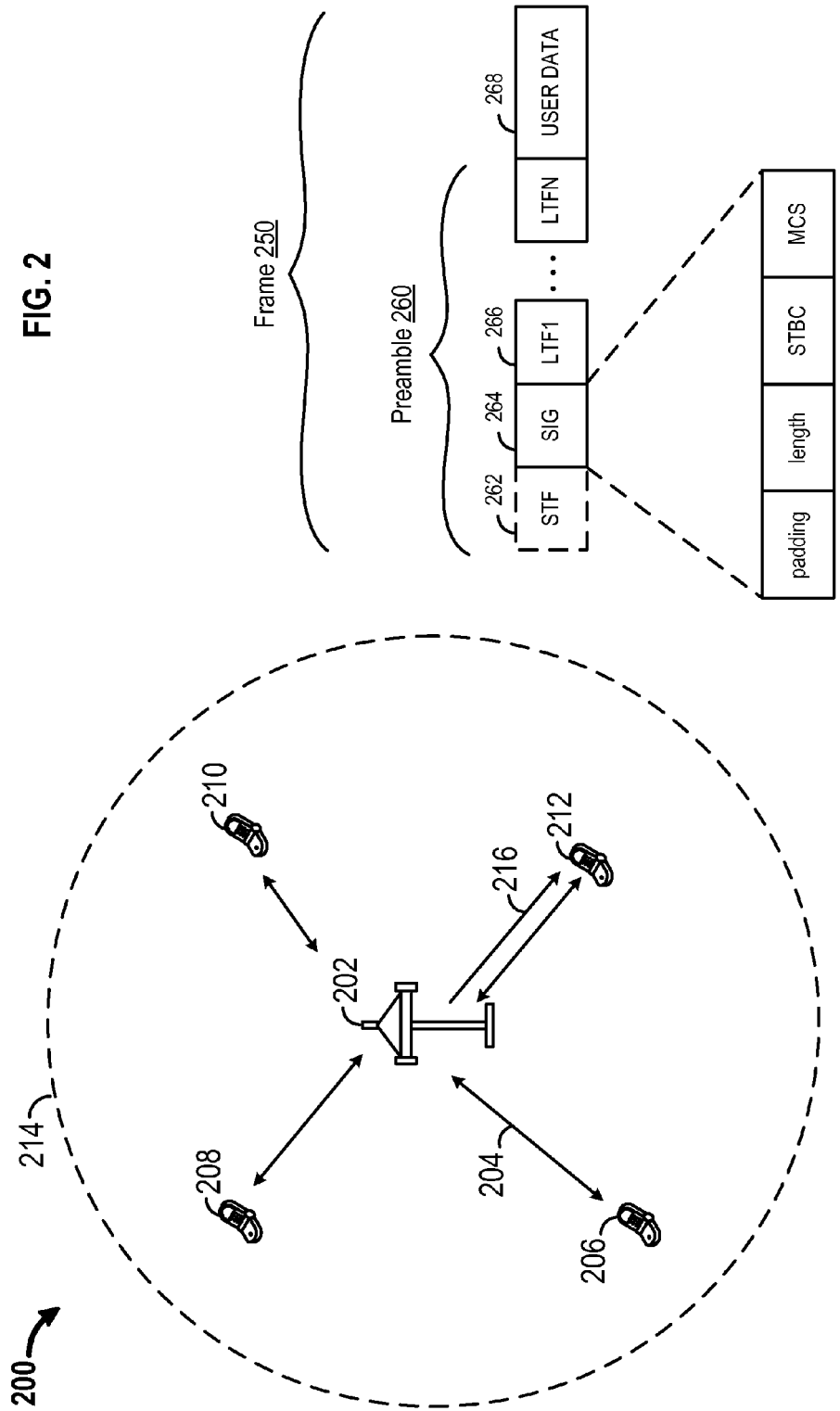
FIG. 2 is a diagram of a wireless network (e.g., a Wi-Fi network employing the IEEE 802.11 standard).

FIG. 2 is a diagram 200 of a wireless network (e.g., a Wi-Fi network employing the IEEE 802.11 standard). The diagram 200 illustrates an AP 202 broadcasting/transmitting within a service area 214. STAs 206, 208, 210, 212 are within the service area 214 of the AP 202 (although only four STAs are shown in FIG. 2, more or less STAs may be within the service area 214).

The AP 202 may transmit symbols (e.g., data symbols or LTF symbols) 204 to one or more STAs (e.g., STAs 206, 208, 210, 212) in one or more frames, and vice versa. A frame 250 may include a preamble 260 and data symbols 268. The preamble 260 may be considered a header of the frame 250 with information identifying a modulation scheme, a transmission rate, and a length of time to transmit the frame 250. The preamble 260 may include a signal (SIG) field 264, a short training field (STF) 264, and one or more long training field (LTF) symbols 266 (e.g., LTF1, LTF2, ..., LTFN). The SIG field 264 may be used to transfer rate and length information. The SIG field 264 may comprise at least one of a padding bit, a packet length, a space-time block code (STBC) bit, and MCS information. Space-time block coding is a wireless communication technique in which multiple copies of a data stream are transmitted across multiple antennas to increase transmit diversity. The STF 262 may be used to improve automatic gain control (AGC) in a multi-transmit and multi-receive system. The LTF symbols 266 may be used to provide the information needed for a receiver (e.g., the STA 206 or the AP 202) to perform channel estimation. The number of LTF symbols may be equal to or greater than the number of space-time streams from different STAs. For example, if there are 4 STAs, there may be 4 LTF symbols (i.e. LTF1, LTF2, LTF3, LTF4). The data symbols 268 may contain the user data to be communicated between the STA 206, for example, and the AP 202.

In Wi-Fi networks such as the one shown in FIG. 2, LDPC and/or BCC encoding may be used in uplink multi-user MIMO and OFDMA transmission. Generally, LDPC codes may be based on a parity check matrix H with y columns and m=y−x rows, in which x may represent a length of a data payload. Each row has ρ number of ones. Each column has γ number of ones. For a given data payload $a=\{a_0, \ldots, a_{x-1}\}$ of length x, an LDPC encoder may generate a codeword $b=\{b_0, \ldots, b_{y-1}\}$ of length y where y>x, such that Hy=0. The codeword may consist of two parts. The first x bits of the codeword may correspond to the bits (or a subset of bits) of the data payload to be transmitted. The other y−x bits of the codeword may be parity check bits $p=\{p_0, \ldots, p_{y-x-1}\}$.

LDPC Encoding/Decoding

Before discussing the use of LDPC coding in uplink multi-user MIMO and OFDMA transmissions, it may be helpful discuss LDPC coding in an uplink single user context.

In a single user case, a STA may need to know the minimum number of data symbols for transmitting a data payload and the number of payload bits to derive the LDPC coding parameters for purposes of LDPC coding and decoding. To determine the minimum number of data symbols for transmitting the payload, the STA 212 may need information such as the medium access control (MAC) packet length (e.g., aggregated MAC protocol data unit (AMPDU) length), the STBC bit, and the modulation and coding scheme (MCS). The MAC packet length may be the length (in bytes) of the data payload to be transmitted. The minimum number of data symbols may be determined by the STA 212 or sent by the AP 202 in a trigger message 216. The minimum number of data symbols for transmitting the data payload (including LDPC coding) may be determined by Eq. 1:

$$N_{sym\_init} = m_{stbc} \times \left\lceil \frac{AMPDU.\text{length} \times 8 + N_{service}}{N_{cbps} \times R \times m_{stbc}} \right\rceil$$

In Eq. 1, $N_{sym\_init}$ is the minimum number of data symbols for transmitting the data payload, $m_{stbc}$ represents a space-time block code value ($m_{stbc}$=2 if STBC is used (space-time block code bit=1) and, otherwise, $m_{stbc}$=1 (space-time block code bit=0)), AMPDU.length represents the aggregated MAC protocol data unit (or AMPDU) length in bytes (or the length of the data payload in bytes before coding), $N_{service}$ represents the number of service bits (e.g., 16 bits), $N_{cbps}$ represents the number of coded bits per symbol, and R represents the MCS code rate (e.g., 4/5). The symbol $\lceil x \rceil$ is a ceiling function that denotes the smallest integer greater than or equal to x.

Having determined the minimum number of data symbols, $N_{sym\_init}$, the number of payload bits (needed for the transmission of the data payload after LDPC coding) may be determined by Eq. 2:

$$N_{pld} = N_{sym\_init} \times N_{cbps} \times R$$

A second number of OFDM symbols for transmitting may be determined by Eq. 3:

$$N_{sym} = N_{sym\_init} + m_{stbc} \times N_{ldpc\_ext}$$

In Eq. 3, the second number of OFDM symbols, $N_{sym}$, represents the minimum number of symbols for transmitting the data payload after LDPC coding plus any extra symbols needed in case the LDPC coding process spills into one or more OFDM symbols. $N_{ldpc\_ext}$ is a one bit flag that indicates whether the LDPC coding will spill into one or more OFDM symbols. Having determined $N_{sym\_init}$ and $N_{pld}$, the STA may derive the LDPC coding parameters such as $N_{cw}$, $L_{ldpc}$, $N_{shrt}$, $N_{punc}$, $N_{rep}$, etc., for purposes of LDPC coding. $N_{cw}$ represents the number of codewords, $L_{ldpc}$ is the LDPC codeword length, $N_{shrt}$ represents the number of shortening zero bits, $N_{punc}$ represents the number of puncture bits, and $N_{rep}$ represents the number of repetition bits. After deriving the LDPC coding parameters, the STA 212 may encode a data payload using LDPC encoding and transmit the LDPC encoded data symbols in a frame (e.g., a frame 250) to the AP 202. To indicate whether an extra LDPC symbol was used for the coding process, the STA 212 may include a padding bit in the frame.

After the LDPC encoded data symbols are transmitted from the STA 212 to the AP 202, the AP 202 may attempt to decode the received LDPC encoded data symbols by determining the LDPC coding parameters based on $N_{sym\_init}$ and $N_{pld}$. In one configuration, if the AP 202 triggers the STA 212's uplink transmission by transmitting the trigger message 216 to the STA 212, the trigger message 216 may indicate to the STA 212 what AMPDU.length to use. In this configuration, the AP 202 may determine the $N_{sym\_init}$ based on Eq. 1:

$$N_{sym\_init} = m_{stbc} \times \left\lceil \frac{AMPDU.length \times 8 + N_{service}}{N_{cbps} \times R \times m_{stbc}} \right\rceil$$

In this configuration, the AP 202 may also know the $m_{stbc}$ value if the $m_{stbc}$ value is included in the trigger message 216. Alternatively, when the STA 212 transmits the encoded LDPC data symbols to the AP 202 in a frame, the frame may include a space-time block code bit associated with the $m_{stbc}$ value. As previously noted, the $m_{stbc}$ is equal to 2 if STBC is used (STBC bit=1), otherwise the $m_{stbc}$ is equal to 1 (STBC bit=0). Having determined $N_{sym\_init}$, the AP 202 may determine the number of payload bits, $N_{pld}$, using Eq. 2.

$$N_{pld} = N_{sym\_init} \times N_{cbps} \times R$$

Having determined $N_{sym\_init}$ and $N_{pld}$, the AP 202 may determine the LDPC parameters used for decoding the LDPC encoded data symbols.

In another configuration, the AP 202 may not have triggered the uplink transmission. In this case, the STA 212 may transmit a frame (e.g., the frame 250) to the AP 202, and the frame may include a SIG field and encoded LDPC data symbols. The SIG field (e.g., L-SIG or X-SIG) may indicate the packet/frame length (in bytes or in number of symbols). In one aspect, the AP 202 may determine the number of encoded data symbols using Eq. 4 (below) when the symbols have a normal guard interval (GI) (800 ns GI):

$$N_{sym} = \left\lfloor \frac{SIG.length}{3} - 3 - N_{LTF} \right\rfloor$$

In this aspect, the SIG.length may represent the total packet length of the frame and may be transmitted by the STA 212 in the SIG field of the frame. Eq. 4 assumes that the SIG.length is provided in bytes. Assuming there is 1 symbol per every 3 bytes, $$\frac{SIG.length}{3}$$

represents the total number of symbols after the SIG field (but including SIG-A) in the frame. However, if SIG.length represents the total number of symbols after the SIG field (e.g., per 4 μs), then $$\frac{SIG.length}{3}$$

may be replaced by SIG.length. The symbol $\lfloor x \rfloor$ is a floor function that denotes the largest integer less than or equal to x. Having determined the total number of symbols after the SIG field in a frame, the total number of symbols may be subtracted by 3 (which may represent SIG field A1, SIG field A2, and STF) and by the number of LTF symbols, $N_{LTF}$. In some cases, $N_{LTF}$ may be determined by the number of space time streams $N_{sts}$. The result is the number of data field symbols, $N_{sym}$. Although this aspect uses 3 as the number of symbols representing SIG-A1, SIG-A2, and STF, other numbers may be used depending on the composition of the fields in the frame.

In another aspect of this configuration, the AP 202 may determine the number of encoded data symbols using Eq. 5 when the symbols have a short guard interval (400 ns GI):

$$N_{sym} = \left\lfloor \frac{\frac{SIG.length}{3} - 3 - N_{LTF}}{0.9} \right\rfloor - ShortGINsymDisambiguationBit$$

In this configuration, the ShortGINsymDisambiguationBit may be transmitted by the STA 212 in the SIG field of the frame (e.g., the second bit of SIG field A2, SIGA2.B1). The ShortGINsymDisambiguationBit may be set to 1 when a short guard interval is used and $N_{sym}$ mod 10=9, otherwise the bit may be set to 0.

Having determined the total number of data symbols, $N_{sym}$, the AP 202 may determine the minimum number of data symbols $N_{sym\_init}$ using Eq. 6:

$$N_{sym\_init} = N_{sym} - m_{stbc} \times N_{ldpc\_ext}$$

In Eq. 6, the STBC value, $m_{stbc}$, may be 2 if space-time block coding is used or 1 if space-time block coding is not used. The $N_{ldpc\_ext}$ is a padding bit that may indicate whether one or more extra OFDM symbols were used for LDPC coding. The $N_{ldpc\_ext}$ may be equal to 0 if no extra symbols were used, and may be equal to 1 if one or more extra symbols were used. The padding bit, $N_{ldpc\_ext}$, may be transmitted by the STA 212 in the SIG field (e.g., in the fourth bit of signal field A2) or the padding bit may be known to the AP 202. Having determined $N_{sym\_init}$, the number of payload bits, $N_{pld}$, may be determined using Eq. 2 mentioned above.

Although only two guard interval examples have been discussed above, other guard intervals (or cyclic prefix lengths) may be used. Accordingly, the calculation for $N_{sym}$ based on SIG.length may change based on the guard interval.

Having discussed LDPC encoding for single user uplink transmission, LDPC encoding may now be discussed with respect to multi-user uplink transmissions. A Wi-Fi network may support LDPC coding for multi-user uplink transmission. Five different options may be employed for multi-user uplink transmission using LDPC coding. Each option is directed to different types of information that may be provided by an AP to a STA. The STA may utilize the information provided by the AP for encoding data for UL MU MIMO or UL OFDMA transmission. As further discussed below, the information may indicate a time duration for an UL frame (e.g., the frame 250 in FIG. 2) or may indicate values of different fields within the frame. In option 1, the STA (e.g., the STA 212) may be in full control, and the AP (e.g., the AP 202) does not limit the time duration of a frame, the data payload size, the MCS, the STBC bit, or the padding bit. In option 2, the AP may mandate/require a maximum time duration for a frame in a trigger message (e.g., the trigger message 216). In option 2, the STA may determine the data payload size, the MCS, the STBC bit, and the padding bit. In option 3, the AP may mandate/require the same frame time duration for all STAs in the trigger message. The STA may decide the data payload size, the MCS, the STBC bit, and padding bit. In option 4, the AP may mandate the same time duration, MCS, and STBC bit for all STAs in the trigger message. The STA may decide the data payload size and the padding bit. In option 5, the AP may mandate the same time duration, MCS, STBC bit, and padding bit for all STAs. The STA may decide the data payload size (or the AP may mandate the data payload size as well).

LDPC Encoding: Option 1

In option 1, as stated above, each STA may have full flexibility. Accordingly, for purposes of LDPC coding, the encoding and decoding may be the same as the single user case. To determine the minimum number of data symbols to transmit the data payload using LDPC coding, the STA 212 may need information such as the MAC packet length (e.g., AMPDU length), the STBC bit, and the MCS. The minimum number of data symbols may be determined by Eq. 1:

$$N_{sym\_init} = m_{stbc} \times \left\lceil \frac{AMPDU.\text{length} \times 8 + N_{service}}{N_{cbps} \times R \times m_{stbc}} \right\rceil$$

In Eq. 1, $N_{sym\_init}$ is the minimum number of data symbols, $m_{stbc}$ represents a space-time block code value ($m_{stbc}=2$ if STBC is used (space-time block code bit=1) and 1 otherwise (space-time block code bit=0)), AMPDU.length represents the aggregated MAC protocol data unit (or AMPDU) length, $N_{service}$ represents the number of service bits (e.g., 16 bits), $N_{cbps}$ represents the number of coded bits per symbol, and R represents the MCS code rate (e.g., 4/5) and may be determined based on the MCS. The symbol ⌈x⌉ is a ceiling function that denotes the smallest integer greater than or equal to x.

Having determined the minimum number of data symbols, $N_{sym\_init}$, the number of payload bits for transmitting the data payload may be determined by Eq. 2:

$$N_{pld} = N_{sym\_init} \times N_{cbps} \times R$$

A second number of OFDM symbols may be determined by Eq. 3:

$$N_{sym} = N_{sym\_init} + m_{stbc} \times N_{ldpc\_ext}$$

In Eq. 3, the second number of OFDM symbols, $N_{sym}$, represents the minimum number of data symbols for transmitting the data payload using LDPC coding plus any extra symbols needed in case the LDPC coding process spills into one or more OFDM symbols. $N_{ldpc\_ext}$ is a one bit flag that indicates whether the LDPC coding will spill into one or more OFDM symbols. Having determined $N_{sym\_init}$ and $N_{pld}$, the STA 212 may derive the LDPC coding parameters such as $N_{cw}$, $L_{ldpc}$, $N_{shrt}$, $N_{punc}$, $N_{rep}$, etc. $N_{cw}$ represents the number of codewords, $L_{ldpc}$ is the LDPC codeword length, $N_{shrt}$ represents the number of shortening zero bits, $N_{punc}$ represents the number of puncture bits, and $N_{rep}$ represents the number of repetition bits. After deriving the LDPC coding parameters, the STA 212 may encode the data payload using LDPC encoding and transmit the LDPC encoded data symbols in a packet/frame (e.g., the frame 250) to the AP 202 (e.g., an AP). To indicate whether an extra LDPC symbol was used for the coding process, the STA 212 may include a padding bit (i.e., $N_{ldpc\_ext}$) in the SIG field 264 of the frame 250. The STA 212 may also include a packet length of the frame to indicate the length of the frame (in bytes or in number of symbols), a STBC bit that indicates whether STBC is used, and a MCS.

After the LDPC encoded data symbols are transmitted from the STA 212 to the AP 202, the AP 202 may attempt to decode the received LDPC encoded data symbols by determining the LDPC coding parameters based on $N_{sym\_init}$ and $N_{pld}$. In one configuration, if the AP 202 triggers the uplink transmission by transmitting a trigger message 216 to the STA 212, the trigger message 216 may indicate to the STA 212 what AMPDU.length to use. In this configuration, the AP 202 may determine the $N_{sym\_init}$ based on Eq. 1:

$$N_{sym\_init} = m_{stbc} \times \left\lceil \frac{AMPDU.\text{length} \times 8 + N_{service}}{N_{cbps} \times R \times m_{stbc}} \right\rceil$$

In another configuration, the AP 202 may not trigger the uplink transmission. In this case, the STA 212 may transmit a frame to the AP 202, and the frame may include a SIG field and encoded LDPC data symbols. The SIG field (e.g., L-SIG or X-SIG) may indicate the packet length of the frame (in bytes or in number of symbols). In one aspect, the AP 202 may determine the number of encoded data symbols using Eq. 4 when the symbols have a normal guard interval (GI) (800 ns GI):

$$N_{sym} = \left\lfloor \frac{SIG.\text{length}}{3} - 3 - N_{LTF} \right\rfloor$$

In this aspect, the SIG.length may represent the total packet length of the frame and may be transmitted by the STA 212 in the SIG field of the frame. Eq. 4 assumes that the SIG.length is provided in bytes. Assuming there is 1 symbol per every 3 bytes, $$\frac{SIG.\text{length}}{3}$$

represents the total number of symbols in the frame. However, if SIG.length represents the total number of symbols (e.g., per 4 μs), then $$\frac{SIG.\text{length}}{3}$$

may be replaced by SIG.length. Having determined the total number of symbols in the frame, the total number of symbols may be subtracted by 3 (which may represent a SIG field A1, a SIG field A2, and an STF symbol) and by the number of LTF symbols, $N_{LTF}$. In some cases, $N_{LTF}$ may be determined based on the number of space time streams $N_{sts}$. The result is the total number of data field symbols, $N_{sym}$.

In another aspect of this configuration, the AP 202 may determine the number of encoded data symbols using Eq. 5 when the symbols have a short guard interval (400 ns GI):

$$N_{sym} = \left\lfloor \frac{\frac{SIG.\text{length}}{3} - 3 - N_{LTF}}{0.9} \right\rfloor - ShortGINsymDisambiguationBit$$

In this configuration, the ShortGINsymDisambiguationBit may be transmitted by the STA 212 in the SIG field of the frame (e.g., the second bit of SIG field A2, SIGA2.B1). The ShortGINsymDisambiguationBit set to 1 when a short guard interval is used and $N_{sym}$ mod 10=9, otherwise the bit may be set to 0.

Having determined the total number of data symbols, $N_{sym}$, the AP 202 can determine the minimum number of data symbols $N_{sym\_init}$ using Eq. 6:

$$N_{sym\_init} = N_{sym} - m_{stbc} \times N_{ldpc\_ext}$$

In Eq. 6, the STBC value, $m_{stbc}$, may be 2 if space-time block coding is used or 1 if space-time block coding is not used. The padding bit, $N_{ldpc\_ext}$, may indicate whether an extra OFDM symbol was used for LDPC coding. The padding bit may be equal to 0 if no extra symbols were used, and may be equal to 1 if one or more extra symbols were used. The padding bit may be transmitted by the STA 212 in the SIG field (e.g., the fourth bit of signal field A2) or the padding bit may be known to the AP 202. Having determined $N_{sym\_init}$, the number of payload bits, $N_{pld}$, may be determined using Eq. 2 mentioned above.

LDPC Encoding: Option 2

For option 2, the AP 202 may indicate a maximum mandatory time duration for a frame (e.g., the frame 250) in the trigger message 216. Although FIG. 2 only shows the trigger message 216 being transmitted to the STA 212, the same trigger message 216 may be transmitted to other STAs (e.g., the STAs 206, 208, 210) served by the AP 202. After the STA 212 receives the trigger message 216, the STA 212 may determine a maximum number of data symbols that may be included in the frame 250 based on Eq. 7:

$$N_{sym\_max,u} = \frac{T_{max} - T_{preamble,u}}{T_{sym}}$$

In Eq. 7, $T_{max}$ the maximum frame time duration as received in the trigger message 216. $T_{preamble,u}$ is the time duration of the preamble for user u corresponding to the STA 212. $T_{sym}$ is the time duration of a symbol, which may be common to all users. $N_{sym\_max,u}$ represents the maximum number of data symbols that may be included the frame 250 to be transmitted by the STA 212 to the AP 202.

To determine the minimum number of data symbols for transmitting a data payload using LDPC coding, the STA 212 may need information such as the MAC packet length (e.g., AMPDU length), the STBC bit, and the MCS. The minimum number of data symbols for transmitting the data payload using LDPC coding may be determined by Eq. 1:

$$N_{sym\_init} = m_{stbc} \times \left\lceil \frac{AMPDU.\text{length} \times 8 + N_{service}}{N_{cbps} \times R \times m_{stbc}} \right\rceil$$

In Eq. 1, $N_{sym\_init}$ is the minimum number of symbols, $m_{stbc}$ represents a STBC value. The $m_{stbc}$=2 if STBC is used (STBC bit=1) and 1 otherwise (STBC bit=0). The AMPDU.length represents the aggregated MAC protocol data unit (AMPDU) length (or the data payload in bytes before coding), $N_{service}$ represents the number of service bits (e.g., 16 bits), $N_{cbps}$ represents the number of coded bits per symbol, and R represents the MCS code rate (e.g., 4/5). R may be determined based on the MCS. The symbol $\lceil x \rceil$ is a ceiling function that denotes the smallest integer greater than or equal to X.

Having determined the minimum number of symbols, $N_{sym\_init}$, the number of payload bits may be determined by Eq. 2:

$$N_{pld} = N_{sym\_init} \times N_{cbps} \times R$$

A second number of OFDM symbols for transmitting the data payload may be determined by Eq. 3:

$$N_{sym} = N_{sym\_init} + m_{stbc} \times N_{ldpc\_ext}$$

In Eq. 3, the second number of OFDM symbols, $N_{sym}$, represents the minimum number of symbols for transmitting the data payload using LDPC coding plus any extra symbols needed in case the LDPC coding process spills into one or more OFDM symbols. In this case, $N_{sym} < N_{sym\_max,u}$ to ensure that the time duration of the frame is less than the mandatory maximum time duration provided by the AP 202. $N_{ldpc\_ext}$ is a one bit flag that indicates whether the LDPC coding will spill into one or more OFDM symbols. Having determined $N_{sym\_init}$ and $N_{pld}$ the STA may derive the LDPC coding parameters such as $N_{cw}$, $L_{ldpc}$, $N_{shrt}$, $N_{punc}$, $N_{rep}$, etc. $N_{cw}$ represents the number of codewords, $L_{ldpc}$ is the LDPC codeword length, $N_{shrt}$ represents the number of shortening zero bits, $N_{punc}$ represents the number of puncture bits, and $N_{rep}$ represents the number of repetition bits. After deriving the LDPC coding parameters, the STA 212 may encode a data payload using LDPC encoding and transmit the LDPC encoded data symbols in a packet/frame to the AP 202. To indicate whether an extra LDPC symbol was used for the coding process, the STA 212 may include a padding bit ($N_{ldpc\_ext}$) in the SIG field 264 (e.g., High Efficiency (HE)-SIG) of the frame 250. The STA 212 may also include a packet length of the frame 250 to indicate the length of the frame (in bytes or in number of symbols), a STBC bit that indicates whether STBC is used, and a MCS.

After the STA 212 transmits the LDPC encoded data symbols to the AP 202, the AP may attempt to decode the received LDPC encoded data symbols by determining the LDPC coding parameters based on $N_{sym\_init}$ and $N_{pld}$. In one configuration, if the AP triggers the uplink transmission by transmitting the trigger message 216 to the STA 212, the trigger message 216 may indicate to the STA 212 what AMPDU.length to use. In this configuration, the AP 202 may determine the $N_{sym\_init}$ based on Eq. 1:

$$N_{sym\_init} = m_{stbc} \times \left\lceil \frac{AMPDU.length \times 8 + N_{service}}{N_{cbps} \times R \times m_{stbc}} \right\rceil$$

Having determined $N_{sym\_init}$ and $N_{pld}$, the AP 202 may determine the LDPC parameters used for decoding the LDPC encoded data symbols.

In another configuration, the AP 202 may not trigger the uplink transmission. In this case, the STA 212 may transmit a frame to the AP 202, and the frame may include a SIG field and encoded LDPC data symbols. The SIG field (e.g., L-SIG, X-SIG, or HE-SIG) may indicate the packet length of the frame (in bytes or in number of symbols). In one aspect, the AP 202 may determine the number of encoded data symbols using Eq. 4 when the symbols have a normal guard interval (GI) (800 ns GI):

$$N_{sym} = \left\lfloor \frac{SIG.length}{3} - 3 - N_{LTF} \right\rfloor$$

In this aspect, the SIG.length may represent the total packet length of the frame and may be transmitted by the STA 212 in the SIG field of the frame. Eq. 4 assumes that the SIG.length is provided in bytes. Assuming there is 1 data symbol for every 3 bytes, $$\frac{SIG.length}{3}$$

represents the total number of symbols in the frame. However, if SIG.length represents the total number of symbols (e.g., per 4 µs), then $$\frac{SIG.length}{3}$$

may be replaced by SIG.length. Having determined the total number of symbols in a frame, the total number of symbols may be subtracted by 3 (which may represent SIG field A1, SIG field A2, and STF) and by the number of LTF symbols, $N_{LTF}$. In some cases, $N_{LTF}$ may be determined by the number of space time streams $N_{sts}$. The result is the number of data field symbols, $N_{sym}$.

In another aspect of this configuration, the AP 202 may determine the number of encoded data symbols using Eq. 5 when the symbols have a short guard interval (400 ns GI):

$$N_{sym} = \left\lfloor \frac{\frac{SIG.length}{3} - 3 - N_{LTF}}{0.9} \right\rfloor - ShortGINsymDisambiguationBit$$

In this configuration, the ShortGINsymDisambiguationBit may be transmitted by the STA 212 in the SIG field of the frame (e.g., the second bit of SIG field A2, SIGA2.B1). The ShortGINsymDisambiguationBit set to 1 when a short guard interval is used and $N_{sym}$ mod 10=9, otherwise the bit may be set to 0.

Having determined the total number of data symbols, $N_{sym}$, the AP 202 may determine the minimum number of data symbols $N_{sym\_init}$ for LDPC encoding using Eq. 6:

$$N_{sym\_init} = N_{sym} - m_{stbc} \times N_{ldpc\_ext}$$

In Eq. 6, the STBC value, $m_{stbc}$, may be 2 if STBC is used or 1 if STBC is not used. The padding bit, $N_{ldpc\_ext}$, may indicate whether one or more extra OFDM symbols were used for LDPC coding. The padding bit may be equal to 0 if no extra symbols were used, and may be equal to 1 if one or more extra symbols were used. The padding bit may be transmitted by the STA 212 in the SIG field (e.g., the fourth bit of signal field A2) or the padding may be known to the AP 202. Having determined $N_{sym\_init}$, the number of payload bits, $N_{pld}$, may be determined using Eq. 2 mentioned above.

In options 1 and 2, different STAs may send frames of different lengths and time duration. This may have an impact on the media reuse and AP receiving status. For certain users ending packets earlier, other STAs may perceive that as a power drop in the on-going transmission and may decide to start using the transmission medium. Also, early termination may result in a power drop which may trigger a reset in the receiver processing of the AP 202.

LDPC Encoding: Option 3

In option 3, the AP 202 may indicate a mandatory (or required) time duration for a frame (e.g., the frame 250) in the trigger message 216. Although FIG. 2 only shows the trigger message 216 being transmitted to the STA 212, the same trigger message 216 may be transmitted to other STAs (e.g., the STAs 206, 208, 210) served by the AP 202. In option 3, all STAs that receive the trigger message 216 would transmit frames having the same time duration. However, the STAs may have the flexibility to determine a data payload size, a MCS, and an STBC value subject to the time duration constraint. After the STA 212 receives the trigger message 216, the STA 212 may determine a number of data symbols that may be included in the frame 250 based on Eq. 8:

$$N_{sym,u} = \frac{T_{total} - T_{preamble,u}}{T_{sym}}$$

In Eq. 8, $T_{total}$ represents the mandatory frame time duration as received in the trigger message 216. $T_{preamble,u}$ is the time duration of the preamble for user u corresponding to STA 212. $T_{sym}$ is the time duration of a symbol, which may be common to all users. $N_{sym,u}$ represents the total number of data symbols that may be included the frame 250 to be transmitted to the AP 202 based on the mandated frame time duration.

LDPC Encoding: Option 3A

In one aspect of option 3, one may assume that every STA needs one or more extra LDPC symbols. As such, for user u, the minimum number of data symbols for transmission of a data payload using LDPC encoding may be determined by Eq. 9:

$$N_{sym\_init,u} = N_{sym,u} - m_{stbc,u}$$

In Eq. 9, $N_{sym\_init,u}$ represents the minimum number of data symbols for LDPC coding for user u and $m_{stbc,u}$ represents the STBC value for user u. In an aspect, $N_{sym\_init,u}$ may represent the minimum number of data symbols for LDPC encoding of the data payload before spill over from LDPC encoding. The STBC value may be 1 or 2 depending on whether STBC is used. Based on $N_{sym\_init,u}$, the STA 212 may determine the number of payload bits based on Eq. 10:

$$N_{pld,u} = N_{sym\_init,u} \times N_{cbps,u} \times R_u$$

In Eq. 10, $N_{cbps,u}$ represents the number of coded bits per symbol for user u and $R_u$ represents the MCS code rate for user u. Having determined $N_{sym\_init,u}$ and $N_{pld,u}$, the STA 212 may use LDPC encoding to encode a data payload for uplink transmission to the AP 202. In an aspect, the STA 212 may construct or generate the data payload, which may be a physical layer data unit (PSDU) having a specific length in octets. The STA 212 may construct the data payload by using MAC layer padding to generate a data payload having a specific length (e.g., based on the mandatory frame time duration), and may use the physical layer padding to fill $N_{sym\_init,u}$ symbols. The data payload may include extra OFDM symbols based on the STBC value, $m_{stbc}$ ($m_{stbc}$=2 if STBC is used, otherwise $m_{stbc}$=1). After constructing the data payload, the STA 212 may encode the data payload with LDPC encoding. In Option 3A, the STA 212 may transmit a STBC bit and an MCS value in the SIG field 264 of the frame 250. The STBC bit may equal to 1 (if STBC is used) or 0 (if STBC is not used). A padding bit may not be transmitted in this case because the assumption is that an extra LDPC symbol is always used.

LDPC Encoding: Option 3B

In another aspect of option 3, one may assume that each STA may determine whether an extra LDPC symbol is needed. As such, for user u, the minimum number of symbols may be determined based on Eq. 11:

$$N_{sym\_init,u} = N_{sym,u} - m_{stbc,u} \times N_{ldpc\_ext}$$

In Eq. 11, the STA 212 determines $N_{sym\_init,u}$ based on whether one or more extra OFDM symbols are needed for LDPC coding as indicated by $N_{ldpc\_ext}$. If extra symbols are needed, then $N_{ldpc\_ext}$ is equal to 1, otherwise $N_{ldpc\_ext}$ is equal to 0. The STBC value, $m_{stbc,u}$, for user u may be equal to 2 if STBC is used, or 1 if STBC is not used.

Based on $N_{sym\_init,u}$, the STA 212 may determine the number of payload bits using Eq. 10:

$$N_{pld,u} = N_{sym\_init,u} \times N_{cbps,u} \times R_u$$

In Eq. 10, $N_{cbps,u}$ represents the number of coded bits per symbol for user u and $R_u$ represents the MCS code rate for user u. Having determined $N_{sym\_init,u}$ and $N_{pld,u}$ the STA 212 may use LDPC encoding to encode a data payload for uplink transmission to the AP 202. In an aspect, the STA 212 may construct or generate the data payload, which may be a physical layer data unit (PSDU) having a specific length in octets. The STA 212 may construct the data payload by using MAC layer padding to generate a data payload having a specific length (e.g., based on the mandatory frame time duration), and may use the physical layer padding to fill $N_{sym\_init,u}$ symbols. The data payload may include extra OFDM symbols based on the STBC value, $m_{stbc}$ ($m_{stbc}$=2 if STBC is used, otherwise $m_{stbc}$=1). After constructing the data payload, the STA 212 may encode the data payload with LDPC encoding. The number of data symbols in the LDPC encoded data symbols may be equal to $N_{sym}$. In Option 3B, the STA 212 may transmit a STBC bit, an MCS value, and a padding bit (corresponding to $N_{ldpc\_ext}$) in the SIG field 264 of the frame 250. The STBC bit may equal to 1 (if STBC is used) or 0 (if STBC is not used).

LDPC Encoding: Option 4

For option 4, the AP 202 may indicate a mandatory (or required) time duration for a frame (e.g., the frame 250), the MCS, and the STBC bit in the trigger message 216. Although FIG. 2 only shows the trigger message 216 being transmitted to the STA 212, the same trigger message 216 may be transmitted to other STAs (e.g., the STAs 206, 208, 210) served by the AP 202. In option 4, all STAs that receive the trigger message 216 would transmit frames having the same time duration as indicated by the AP 202. The frames would have a per user MCS and STBC value as indicated by the AP 202. The STAs may determine the data payload size (AMPDU.length) and padding (e.g., the padding bit, $N_{ldpc\_ext}$) subject to the parameters received in the trigger message 216. After the STA 212 receives the trigger message 216, the STA 212 may determine a number of data symbols that may be included in the frame 250 based on Eq. 8:

$$N_{sym,u} = \frac{T_{total} - T_{preamble,u}}{T_{sym}}$$

In Eq. 8, $T_{total}$ represents the mandatory frame time duration as received in the trigger message 216. $T_{preamble,u}$ is the time duration of the preamble for user u corresponding to STA 212. $T_{sym}$ is the time duration of a symbol, which may be common to all users. $N_{sym,u}$ represents the total number of data symbols that may be included the frame 250 to be transmitted to the AP 202.

LDPC Encoding: Option 4A

In one aspect of option 4, one may assume that every STA needs one or more extra LDPC symbols. As such, for user u, the minimum number of symbols may be determined based on Eq. 9:

$$N_{sym\_init,u} = N_{sym,u} - m_{stbc,u}$$

In Eq. 9, $N_{sym\_init,u}$ represents the minimum number of data symbols for transmitting the data payload using LDPC coding for user u, and $m_{stbc,u}$ represents the STBC value for user u. The STBC value may be 1 or 2 depending on whether STBC is used. Based on $N_{sym\_init,u}$, the STA 212 may determine the number of payload bits for transmitting the data payload based on Eq. 10:

$$N_{pld,u} = N_{sym\_init,u} \times N_{cbps,u} \times R_u$$

In Eq. 10, $N_{cbps,u}$ represents the number of coded bits per symbol for user u and $R_u$ represents the MCS code rate for user u. Having determined the parameters $N_{sym\_init,u}$ and $N_{pld,u}$ the STA 212 may use LDPC encoding to encode a data payload for uplink transmission to the STA 212. The STA 212 may use MAC layer padding to generate a set of LDPC data payload having a specific length (e.g., the LDPC data payload may be a PSDU having a specific length in octets) and may use physical layer padding to fill $N_{sym\_init,u}$ symbols. The LDPC encoded data symbols may include an extra OFDM symbol based on the STBC value, $m_{stbc}$.

LDPC Encoding: Option 4B

In another aspect of option 4, one may assume that each STA may determine whether an extra LDPC symbol is needed. As such, for user u, the minimum number of data symbols may be determined based on Eq. 11:

$$N_{sym\_init,u} = N_{sym,u} - m_{stbc,u} \times N_{ldpc\_ext}$$

In Eq. 11, the STA 212 determines $N_{sym\_init,u}$ based on whether one or more extra OFDM symbols are needed for LDPC coding as denoted by $N_{ldpc\_ext}$. If extra symbols are needed, then $N_{ldpc\_ext}$ is equal to 1, otherwise $N_{ldpc\_ext}$ is equal to 0. The STBC value for user u, $m_{stbc,u}$ may be equal to 2 if STBC is used (STBC bit=1), or 1 if STBC is not used (STBC bit=0).

Based on $N_{sym\_init,u}$, the STA 212 may determine the number of payload bits based on Eq. 10:

$$N_{pld,u} = N_{sym\_init,u} \times N_{cbps,u} \times R_u$$

In Eq. 10, $N_{cbps,u}$ represents the number of coded bits per symbol for user u and $R_u$ represents the MCS code rate for user u. Having determined $N_{sym\_init,u}$ and $N_{pld,u}$ the STA 212 may use LDPC encoding to encode a data payload for uplink transmission to the AP 202. The STA 212 may use MAC layer padding to generate a set of LDPC data payload having a specific length (e.g., the LDPC data payload may be a PSDU having a specific length in octets) and may use physical layer padding to fill $N_{sym\_init,u}$ symbols. The LDPC encoded data symbols may include an extra OFDM symbol based on the STBC value, $m_{stbc}$. The number of data symbols in the LDPC encoded data symbols may be equal to $N_{sym}$. In Option 4B, the STA 212 may transmit a padding bit (corresponding to $N_{ldpc\_ext}$) in the SIG field 264 of the frame 250. The padding bit may be equal to 1 if extra OFDM symbols were needed for LDPC coding or 0 if extra OFDM symbols were not needed for LDPC coding.

LDPC Encoding: Option 5

For option 5, the AP 202 may indicate a mandatory (or required) time duration for a frame (e.g., the frame 250), a data packet length value, the MCS, the STBC bit, and the padding bit in the trigger message 216. Although FIG. 2 only shows the trigger message 216 being transmitted to the STA 212, the same trigger message 216 may be transmitted to other STAs (e.g., the STAs 206, 208, 210) served by the AP 202. In option 5, all STAs that receive the trigger message 216 would transmit frames having the same time duration as indicated by the AP 202. The frames would have a per user MCS value as indicated by the AP 202. Also, all the STAs would have the same number of extra OFDM symbols, if any, for LDPC coding. In an aspect, the AP 202 may also specify a data payload size for the STAs. If not, the STAs may determine the data payload size.

LDPC Encoding: Option 5—Common STBC Setting

In one aspect of option 5, all the STAs may have the same STBC setting; that is, the STBC bit may be the same for all of the STAs. For example, all STAs served by the AP 202 may use STBC or none of them may use STBC. In this aspect, the AP 202 may transmit the data packet length value to the STAs in the trigger message 216. The data packet length value may correspond to $N_{sym}$, which may be determined by the AP 202 using Eq. 12:

$$N_{sym} = N_{sym\_max\_init} + m_{stbc} \times N_{ldpc\_ext}$$

In Eq. 12, $N_{ldpc\_ext}$ represents the padding bit and may be determined based on the padding bit received in the trigger message 216 from the AP 202. The $N_{ldpc\_ext}$ bit is set to 1 if at least one of the LDPC users requires an extra OFDM symbol (or symbols), otherwise, the $N_{ldpc\_ext}$ bit is set to 0. $N_{sym\_max\_init}$ represents the largest (or maximum) minimum number of data symbols, $N_{sym\_init}$, among all users served by the AP 202. $N_{sym\_max\_init}$ may be determined by determining the $N_{sym\_init}$ for each of the n users served by the AP 202 and taking the maximum determined $N_{sym\_init}$, as shown in Eqs. 13A and 13B, respectively:

$$N_{sym\_max\_init} = \max\{N_{sym\_init,u}\} \begin{array}{l} u = n-1 \\ u = 0 \end{array} \quad \text{Eq. 13A}$$

$$N_{sym\_init,u} = \quad \text{Eq. 13B}$$

$$\begin{cases} m_{stbc} \times \left\lceil \dfrac{8 \times \text{length}_u + N_{service}}{m_{stbc} \times N_{cbps} \times R_u} \right\rceil & \text{for } LDPC \text{ users} \\ m_{stbc} \times \left\lceil \dfrac{8 \times \text{length}_u + N_{service} + 6 \times N_{ES,u}}{m_{stbc} \times N_{cbps} \times R_u} \right\rceil & \text{for } BCC \text{ users} \end{cases}$$

In Eq. 13B, for LDPC users, the $N_{sym\_init,u}$ is determined using the top version of Eq. 13B, and for BCC users, the $N_{sym\_init,u}$ is determined using the bottom version of Eq. 13B. As such, Eq. 13A determines the max $N_{sym\_init,u}$ for all users/STAs that use either LDPC or BCC encoding. Having determined the $N_{sym\_max\_init}$, the AP 202 may determine the data packet length value, $N_{sym}$, using Eq. 14:

$$N_{sym} = N_{sym\_max\_init} + m_{stbc} \times N_{ldpc\_ext}$$

In Eq. 14, the $m_{stbc}$ and $N_{ldpc\_ext}$ may be the same for all STAs (e.g., $m_{stbc}=1$, $N_{ldpc\_ext}=1$) based on the STBC bit and the padding bit in the trigger message 216 from the AP 202. The $N_{ldpc\_ext}$ bit is set to 1 if at least one of the LDPC users requires an extra OFDM symbol (or symbols), otherwise, the $N_{ldpc\_ext}$ bit is set to 0. Having determined the data packet length value, $N_{sym}$, the AP 202 may transmit the data packet length value, $N_{sym}$, to the STA 212 and other STAs in the trigger message 216. The STA 212 may receive the trigger message 216 that includes the mandatory time duration, the MCS, the STBC bit, the padding bit, and the data packet length value and determine the minimum number of data symbols for transmitting a data payload using LDPC encoding. The minimum number of data symbols may be determined using Eq. 15:

$$N_{sym\_max\_init} = N_{sym} - m_{stbc} \times N_{ldpc\_ext}$$

The $m_{stbc}$ may be based on the STBC bit received in the trigger message 216, and the $N_{ldpc\_ext}$ may be based on the padding bit received in the trigger message 216. Having determined the minimum number of data symbols, $N_{sym\_max\_init}$, the STA 212 may determine the number of payload bits using Eq. 16:

$$N_{pld,u} = N_{sym\_max\_init} \times N_{cbps,u} \times R_u$$

In Eq. 16, $R_u$ may be based on the MCS received in the trigger message 216. Having determined $N_{sym\_max\_init}$ and $N_{pld,u}$, the STA 212 may use LDPC encoding to encode a data payload for uplink transmission to the AP 202. The STA 212 may use MAC layer padding to generate a set of LDPC data payload having a specific length (e.g., the LDPC data payload may be a PSDU having a specific length in octets) and may use physical layer padding to fill $N_{sym\_max\_init,u}$ symbols. The LDPC encoded data symbols may include an extra OFDM symbol based on the STBC value, $m_{stbc}$, and the padding bit, $N_{ldpc\_ext}$.

LDPC Encoding: Option 5—Per User STBC Setting

In another aspect of option 5, each of the STAs may initially have different STBC settings. In this aspect, the AP 202 may determine the maximum STBC value for all the STAs being served by the AP 202 and determine the largest minimum number of data symbols to be used for all STAs based on the maximum STBC value and the largest minimum number of data symbols among the STAs. With respect to determining largest minimum number of data symbols among the STAs, all STAs being served by the AP 202 should be included (e.g., STAs transmitting LDPC encoded data symbols and STAs transmitting BCC encoded data symbols). Similar to Eqs. 13A and 13B, the largest (or maximum) minimum number of data symbols to be used for n STAs may be determined using Eqs. 17A and 17B, respectively:

$$N_{sym\_max\_init} = \qquad\qquad \text{Eq. 17A}$$

$$\max\{m_{stbc,u}\} \begin{matrix} u=n-1 \\ u=0 \end{matrix} \times \left\lceil \frac{\max\{N_{sym\_init,u}\} \begin{matrix} u=n-1 \\ u=0 \end{matrix}}{\max\{m_{stbc,u}\} \begin{matrix} u=n-1 \\ u=0 \end{matrix}} \right\rceil$$

$$N_{sym\_init,u} = \qquad\qquad \text{Eq. 17B}$$

$$\begin{cases} m_{stbc} \times \left\lceil \dfrac{8 \times length_u + N_{service}}{m_{stbc} \times N_{cbps} \times R_u} \right\rceil & \text{for LDPC users} \\ m_{stbc} \times \left\lceil \dfrac{8 \times length_u + N_{service} + 6 \times N_{ES,u}}{m_{stbc} \times N_{cbps} \times R_u} \right\rceil & \text{for BCC users} \end{cases}$$

In Eq. 17B, for LDPC users, the $N_{sym\_init,u}$ is determined using the top version of Eq. 17B, and for BCC users, the $N_{sym\_init,u}$ is determined using the bottom version of Eq. 17B. As such, Eq. 17A determines the max $N_{sym\_init,u}$ for all users/STAs that use either LDPC or BCC encoding. Having determined the $N_{sym\_max\_init}$, the AP 202 may determine the data packet length value, $N_{sym}$, using Eq. 18:

$$N_{sym} = N_{sym\_max\_init} + \max\{m_{stbc,u}\} \begin{matrix} u=n-1 \\ u=0 \end{matrix} \times N_{ldpc\_ext}$$

In Eqs. 17A and 18, the $m_{stbc,u}$ may be the $m_{stbc}$ for user u, and max $\{m_{stbc,u}\}$ may be the maximum $m_{stbc}$ among all n users, and the n users may include users that utilize either LDPC or BCC encoding for data symbols. In Eq. 18, the $N_{ldpc\_ext}$ bit is set to 1 if at least one of the LDPC users requires an extra OFDM symbol (or symbols), otherwise, the $N_{ldpc\_ext}$ bit is set to 0. Having determined the data packet length value, $N_{sym}$, the AP 202 may transmit the packet length value, $N_{sym}$, to the STA 212 and other STAs in the trigger message 216. The STA 212 may receive the trigger message 216 that includes the mandatory time duration, the MCS, the STBC bit, the padding bit, and the data packet length value and determine the minimum number of data symbols for transmitting a data payload. The minimum number of data symbols may be determined using Eq. 19:

$$N_{sym\_max\_init} = N_{sym} - m_{stbc,max} \times N_{ldpc\_ext}$$

The $m_{stbc,max}$ may be based on the STBC bit received in the trigger message 216, and the $N_{ldpc\_ext}$ may be based on the padding bit received in the trigger message 216. The $m_{stbc,max}$ may represent the maximum STBC value among the n STAs served by the AP 202. Having determined the minimum number of data symbols, $N_{sym\_max\_init}$, the STA 212 may determine the number of payload bits using Eq. 20:

$$N_{pld,u} = N_{sym\_max\_init} \times N_{cbps,u} \times R_u$$

In Eq. 20, $R_u$ may be based on the MCS received in the trigger message 216. Having determined $N_{sym\_max\_init}$ and $N_{pld,u}$, the STA 212 may use LDPC encoding to encode a data payload for uplink transmission to the AP 202. The STA 212 may use MAC layer padding to generate a set of LDPC data payload having a specific length (e.g., the LDPC data payload may be a PSDU having a specific length in octets) and may use physical layer padding to fill $N_{sym\_max\_init,u}$ symbols. The LDPC encoded data symbols may include an extra OFDM symbol based on the STBC value, $m_{stbc}$.

BCC Encoding/Decoding

As previously discussed, in addition the LDPC encoding, BCC encoding may also be used to encode the symbols for uplink transmission to the AP 202. In BCC encoding, there may be at three signaling options for multi-user uplink transmission to the AP 202. Each option is directed to different types of information that may be provided by an AP to a STA. The STA may utilize the information provided by the AP for encoding data for UL MU MIMO or UL OFDMA transmission. As further discussed below, the information may indicate a time duration for an UL frame (e.g., the frame 250 in FIG. 2) or may indicate values of different fields within the frame.

BCC Encoding: Option 1

In option 1, the AP 202 may indicate a mandatory (or required) time duration for a frame (e.g., the frame 250) in the trigger message 216. Although FIG. 2 only shows the trigger message 216 being transmitted to the STA 212, the same trigger message 216 may be transmitted to other STAs (e.g., the STAs 206, 208, 210) served by the AP 202. In option 1, all STAs that receive the trigger message 216 would transmit frames having the same time duration. However, the STAs may have the flexibility to determine a data payload size, a MCS, and an STBC value subject to the time duration constraint. After the STA 212 receives the trigger message 216, the STA 212 may determine a number of data symbols that may be included in the frame 250 based on Eq. 8:

$$N_{sym,u} = \frac{T_{total} - T_{preamble,u}}{T_{sym}}$$

In Eq. 8, $T_{total}$ represents the mandatory frame time duration as received in the trigger message 216. $T_{preamble,u}$ is the time duration of the preamble for user u corresponding to STA 212. $T_{sym}$ is the time duration of a symbol, which may be common to all users. $N_{sym,u}$ represents the total number of data symbols that may be included the frame 250 to be transmitted to the AP 202.

In option 1, for user u corresponding to the STA 212, the minimum number of data symbols is equal to $N_{sym,u}$. Based on $N_{sym,u}$, the STA 212 may determine the number of payload bits using Eq. 21:

$$N_{pld,u} = N_{sym,u} \times N_{cbps,u} \times R_u$$

Having determined $N_{sym,u}$ and $N_{pld,u}$ the STA 212 may use BCC encoding to encode a data payload for uplink transmission to the AP 202. To generate the data payload, the STA 212 may use MAC layer padding to generate a data payload of sufficient length (e.g., based on the mandatory frame time duration). The STA 212 may use physical layer padding to fill $N_{sym,u}$ symbols. The STA 212 may add tail bits (e.g., 8 bits) placed at the very end of the data payload. After generating the data payload, the STA 212 may perform BCC encoding on the data payload. In this option, the STA 212 may transmit a STBC bit and an MCS value in the SIG field 264 of the frame 250. The STBC bit may equal to 1 (if STBC is used) or 0 (if STBC is not used).

BCC Encoding: Option 2

In option 2, the AP 202 may indicate a mandatory (or required) time duration for a frame (e.g., the frame 250), the MCS, and the STBC bit in the trigger message 216. Although FIG. 2 only shows the trigger message 216 being transmitted to the STA 212, the same trigger message 216 may be transmitted to other STAs (e.g., the STAs 206, 208, 210) served by the AP 202. In option 2, all STAs that receive the trigger message 216 would transmit frames having the same time duration, a per user MCS, and a per user STBC bit. The STA 212 may determine whether to use STBC based on the received STBC bit. As such, the STA 212 may be associated with an $m_{stbc}$ value determined based on the received STBC bit. However, the STAs may have the flexibility to determine the data payload size. After the STA 212 receives the trigger message 216, the STA 212 may determine a number of data symbols that may be included in the frame 250 based on Eq. 8:

$$N_{sym,u} = \frac{T_{total} - T_{preamble,u}}{T_{sym}}$$

In Eq. 8, $T_{total}$ represents the mandatory frame time duration as received in the trigger message 216. $T_{preamble,u}$ is the time duration of the preamble for user u corresponding to STA 212. $T_{sym}$ is the time duration of a symbol, which may be common to all users. $N_{sym,u}$ represents the total number of data symbols that may be included the frame 250 to be transmitted to the AP 202.

In option 2, for user u corresponding to the STA 212, the minimum number of data symbols is equal to $N_{sym,u}$. Based on $N_{sym,u}$, the STA 212 may determine the number of payload bits using Eq. 21:

$$N_{pld,u} = N_{sym,u} \times N_{cbps,u} \times R_u$$

Having determined $N_{sym,u}$ and $N_{pld,u}$ the STA 212 may use BCC encoding to encode a data payload for uplink transmission to the AP 202. To generate the data payload, the STA 212 may use MAC layer padding to generate a data payload of sufficient length (e.g., based on the mandatory frame time duration). The STA 212 may use physical layer padding to fill $N_{sym,u}$ symbols. The STA 212 may add tail bits (e.g., 8 bits) placed at the very end of the data payload. After generating the data payload, the STA 212 may perform BCC encoding on the data payload. In this option, the STA 212 may transmit a STBC bit and an MCS value in the SIG field 264 of the frame 250. The STBC bit may equal to 1 (if STBC is used) or 0 (if STBC is not used).

BCC Encoding: Option 3

For option 3, the AP 202 may indicate a mandatory (or required) time duration for a frame (e.g., the frame 250), a data packet length value, the MCS, and the STBC bit in the trigger message 216. Although FIG. 2 only shows the trigger message 216 being transmitted to the STA 212, the same trigger message 216 may be transmitted to other STAs (e.g., the STAs 206, 208, 210) served by the AP 202. In option 3, all STAs that receive the trigger message 216 would transmit frames having the same time duration as indicated by the AP 202. The frames would have a per user MCS and a per user STBC value.

BCC Encoding: Option 3—Common STBC Setting

In one aspect of option 3, all the STAs may have the same STBC setting; that is, the STBC bit may be the same for all of the STAs. For example, all STAs served by the AP 202 may use STBC or none of them may use STBC. In this aspect, the AP 202 may transmit the data packet length value to the STAs in the trigger message 216. The data packet length value may correspond to $N_{sym}$, which may be determined by the AP 202 using Eq. 22:

$$N_{sym} = N_{sym\_max}$$

In Eq. 22, $N_{sym\_max}$ represents the largest (or maximum) minimum number of data symbols, $N_{sym}$, among all users served by the AP 202. $N_{sym\_max}$ may be determined by determining the $N_{sym}$ for each of the n users served by the AP 202 and taking the maximum determined $N_{sym\_max}$, as shown in Eqs. 23A and 23B, respectively:

$$N_{sym\_max} = \max\{m_{sym\_init,u}\} \begin{array}{l} u = n-1 \\ u = 0 \end{array} \quad \text{Eq. 23A}$$

$$N_{sym\_init,u} = \quad \text{Eq. 23B}$$

$$\begin{cases} m_{stbc} \times \left\lceil \frac{8 \times length_u + N_{service}}{m_{stbc} \times N_{cbps} \times R_u} \right\rceil & \text{for LDPC users} \\ m_{stbc} \times \left\lceil \frac{8 \times length_u + N_{service} + 6 \times N_{ES,u}}{m_{stbc} \times N_{cbps} \times R_u} \right\rceil & \text{for BCC users} \end{cases}$$

In Eq. 23B, for LDPC users, the $N_{sym\_init,u}$ is determined using the top version of Eq. 23B, and for BCC users, the $N_{sym\_init,u}$ is determined using the bottom version of Eq. 23B. As such, Eq. 23A determines the max $N_{sym\_init,u}$ for all users/STAs that use either LDPC or BCC encoding. In Eq. 23A, the n users may include users corresponding to STAs that use either LDPC or BCC encoding for the data symbols. In Eq. 23B, $N_{es,u}$ is a number of BCC encoders for user u.

Having determined the $N_{sym\_max}$, the AP 202 may determine the data packet length value, $N_{sym}$, using Eq. 22:

$$N_{sym} = N_{sym\_max}$$

Having determined the data packet length value, $N_{sym}$, the AP 202 may transmit the data packet length value, $N_{sym}$, to the STA 212 and other STAs in the trigger message 216. The STA 212 may receive the trigger message 216 that includes the mandatory time duration, the MCS, the STBC bit, and the data packet length value. The STA 212 may determine that the minimum number of data symbols for transmitting a data payload, $N_{sym,u}$ using BCC encoding is equal to the received $N_{sym}$. Having determined the minimum number of data symbols, $N_{sym,u}$, the STA 212 may determine the number of payload bits using Eq. 24:

$$N_{pld,u} = N_{sym,u} \times N_{cbps,u} \times R_u$$

In Eq. 24, $R_u$ may be based on the MCS received in the trigger message 216. Having determined $N_{sym,u}$ and $N_{pld,u}$, the STA 212 may use BCC encoding to encode a data payload for uplink transmission to the AP 202. To generate the data payload, the STA 212 may use MAC layer padding to generate a data payload of sufficient length (e.g., based on the mandatory frame time duration). The STA 212 may use physical layer padding to fill $N_{sym,u}$ symbols. The STA 212 may add tail bits (e.g., 8 bits) placed at the very end of the data payload. After generating the data payload, the STA 212 may perform BCC encoding on the data payload.

BCC Encoding: Option 3—Per User STBC Setting

In another aspect of option 5, each of the STAs may initially have different STBC settings. In this aspect, the AP 202 may determine the maximum STBC value for all the STAs and determine the largest minimum number of data symbols to be used for all STAs based on the maximum STBC value and the largest minimum number of data symbols among the STAs. Similar to Eqs. 23A and 23B, the largest (or maximum) minimum number of data symbols to be used for n STAs may be determined using Eqs. 25A and 25B:

$$N_{sym\_max} = \max\{m_{stbc,u}\}_{u=0}^{u=n-1} \times \left\lceil \frac{\max\{N_{sym\_init,u}\}_{u=0}^{u=n-1}}{\max\{m_{stbc,u}\}_{u=0}^{u=n-1}} \right\rceil \quad \text{Eq. 25A}$$

$$N_{sym\_init,u} = \quad \text{Eq. 25B}$$
$$\begin{cases} m_{stbc} \times \left\lceil \frac{8 \times length_u + N_{service}}{m_{stbc} \times N_{cbps} \times R_u} \right\rceil & \text{for LDPC users} \\ m_{stbc} \times \left\lceil \frac{8 \times length_u + N_{service} + 6 \times N_{ES,u}}{m_{stbc} \times N_{cbps} \times R_u} \right\rceil & \text{for BCC users} \end{cases}$$

In Eq. 25B, for LDPC users, the $N_{sym\_init,u}$ is determined using the top version of Eq. 25B, and for BCC users, the $N_{sym\_init,u}$ is determined using the bottom version of Eq. 25B. As such, Eq. 25A determines the max $N_{sym\_init,u}$ for all users/STAs that use either LDPC or BCC encoding. In Eq. 25B, $N_{es,u}$ is a number of BCC encoders for user u. In this option, having determined the $N_{sym\_max}$, the AP 202 may determine the data packet length value, $N_{sym}$, using Eq. 22:

$$N_{sym} = N_{sym\_max}$$

In this aspect, $N_{sym}$ is based on a maximum symbol requirement for n STAs and a maximum STBC value for n STAs served by the AP 202. Having determined the data packet length value, $N_{sym}$, the AP 202 may transmit the data packet length value, $N_{sym}$, to the STA 212 and other STAs in the trigger message 216. The STA 212 may receive the trigger message 216 that includes the mandatory time duration, the MCS, the STBC bit, and the data packet length value. The STA 212 may determine that the minimum number of data symbols for transmitting a data payload, $N_{sym,u}$, using BCC encoding is equal to the received $N_{sym}$. Having determined the minimum number of data symbols, $N_{sym,u}$, the STA 212 may determine the number of payload bits using Eq. 24:

$$N_{pld,u} = N_{sym,u} \times N_{cbps,u} \times R_u$$

In Eq. 24, $R_u$ may be based on the MCS received in the trigger message 216. Having determined $N_{sym,u}$ and $N_{pld,u}$, the STA 212 may use BCC encoding to encode a data payload for uplink transmission to the AP 202. To generate the data payload, the STA 212 may use MAC layer padding to generate a data payload of sufficient length (e.g., based on the mandatory frame time duration). The STA 212 may use physical layer padding to fill $N_{sym,u}$ symbols. The STA 212 may add tail bits (e.g., 8 bits) placed at the very end of the data payload. After generating the data payload, the STA 212 may perform BCC encoding on the data payload.

For any of the BCC encoding options, after the AP 202 receives the BCC encoded data payload, the AP 202 may attempt to decode the BCC encoded data symbols by determining the BCC coding parameters. The AP 202 may determine the BCC coding parameters by determining $N_{sym,u}$ and $N_{pld,u}$ based on the equations previously discussed. Subsequently, the AP 202 may decode the BCC encoded data payload based on the BCC coding parameters.

Although the aforementioned procedures and techniques use LDPC or BCC encoding as examples, other types of encoding may also be utilized. As such, it should be appreciated that the teachings and techniques discussed herein may be extended to other types of encoding for wireless transmissions.

Figure 3:
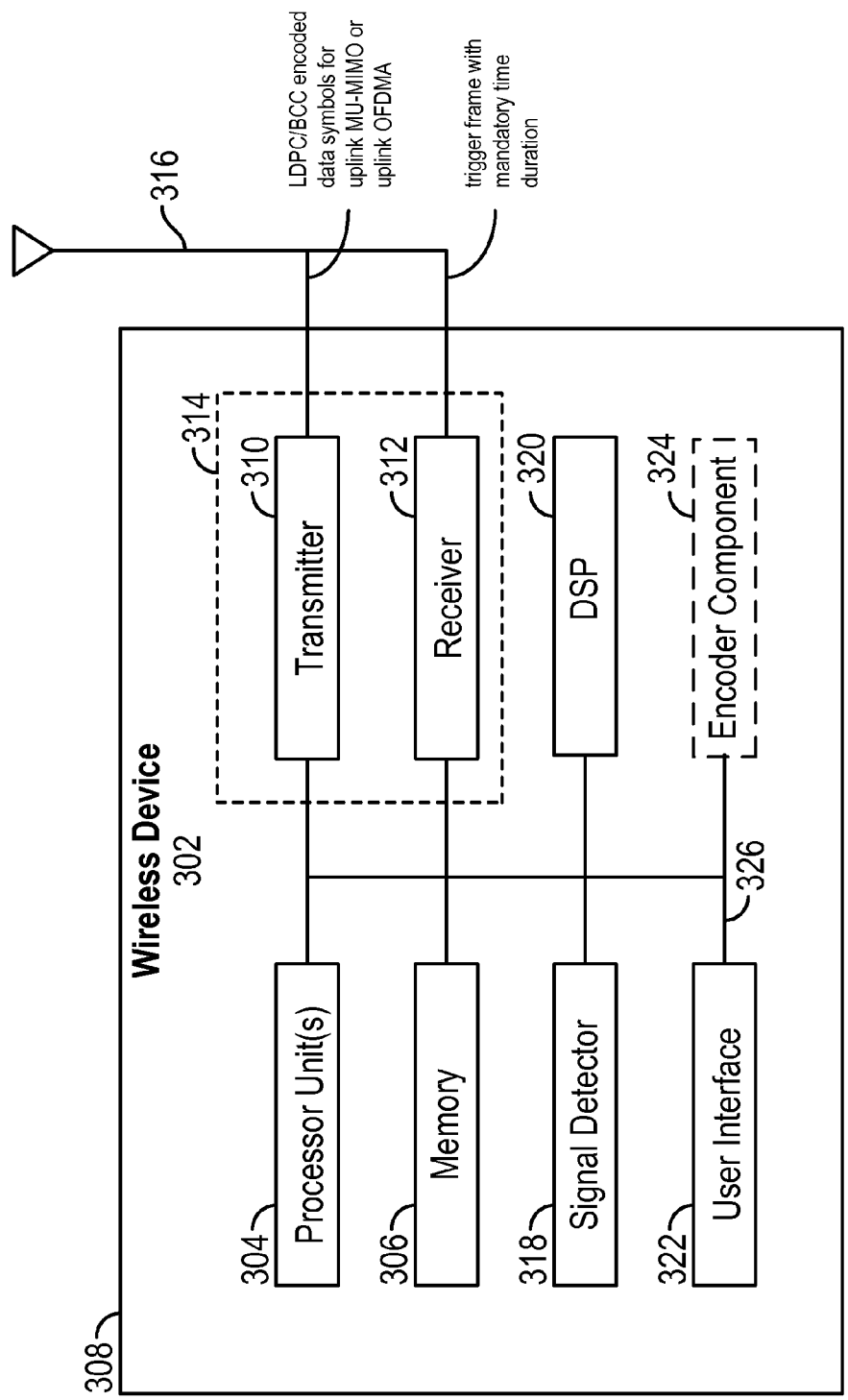
FIG. 3 is a functional block diagram of a wireless device that may be employed within the wireless communication system of FIG. 1 for transmitting LDPC or BCC encoded data symbols.

FIG. 3 is a functional block diagram of a wireless device 302 that may be employed within the wireless communication system 100 of FIG. 1 for transmitting LDPC or BCC encoded data symbols. The wireless device 302 is an example of a device that may be configured to implement the various methods described herein. For example, the wireless device 302 may be the STAs 112, 114, 116, 118, or the STAs 206, 208, 210, 212.

The wireless device 302 may include a processor 304 which controls operation of the wireless device 302. The processor 304 may also be referred to as a central processing unit (CPU). Memory 306, which may include both read-only memory (ROM) and random access memory (RAM), may provide instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable (by the processor 304, for example) to implement the methods described herein.

The processor 304 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 302 may also include a housing 308, and the wireless device 302 may include a transmitter 310 and/or a receiver 312 to allow transmission and reception of data between the wireless device 302 and a remote device. The transmitter 310 and the receiver 312 may be combined into a transceiver 314. An antenna 316 may be attached to the housing 308 and electrically coupled to the transceiver 314. The wireless device 302 may also include multiple transmitters, multiple receivers, multiple transceivers, and/or multiple antennas.

The wireless device 302 may also include a signal detector 318 that may be used to detect and quantify the level of signals received by the transceiver 314 or the receiver 312. The signal detector 318 may detect such signals as total energy, energy per subcarrier per symbol, power spectral density, and other signals. The wireless device 302 may also include a DSP 320 for use in processing signals. The DSP 320 may be configured to generate a packet for transmission. In some aspects, the packet may comprise a physical layer convergence protocol (PLCP) protocol data unit (PPDU).

The wireless device 302 may further comprise a user interface 322 in some aspects. The user interface 322 may comprise a keypad, a microphone, a speaker, and/or a display. The user interface 322 may include any element or component that conveys information to a user of the wireless device 302 and/or receives input from the user.

When the wireless device 302 is implemented as a STA (e.g., the STA 114, the STA 206), the wireless device 302 may also comprise an encoder component 324. The encoder component 324 may be configured to determine a number of data symbols for transmitting a data payload, determine a number of payload bits for transmitting the data payload based on the determined number of data symbols, and transmit a data frame. The data frame may include a signal field and data symbols encoded based on the data payload, the determined number of data symbols, and the determined number of payload bits. The data symbols may be encoded using LDPC encoding or BCC encoding. The encoder component 324 may be configured to determine a second number of data symbols for transmitting the data payload based on the determined number of data symbols. The signal field may include at least one of a padding bit, a packet length, a space-time block code bit, or a modulation and coding scheme value. The encoder component 324 may be configured to receive a trigger message. The trigger message may include at least one of a maximum time duration for the data frame, a mandatory time duration for the data frame, a modulation and coding scheme for the data frame, a space-time block code bit, a data packet length value, or a padding bit.

In one configuration, the trigger message may include the maximum time duration for the data frame, and the encoder component 324 may be configured to determine a maximum number of data symbols based the maximum time duration for the data frame and determine a second number of data symbols for transmitting the data payload based on the determined number of data symbols. The second number of data symbols may be less than the maximum number of data symbols. In another configuration, the trigger message may include the mandatory time duration for the data frame and the wireless device 302 may be associated with a space-time block code value. The encoder component 324 may be configured to determine a second number of data symbols for transmitting the data payload based on the mandatory time duration for the data frame. The encoder component 324 may be configured to determine the number of data symbols for transmitting the data payload based on a difference between the determined second number of data symbols and the space-time block code value. The data symbols may be padded to fill the determined number of data symbols for transmitting the data payload and may include a third number of data symbols determined based on the space-time block code value. The signal field may include a space-time block code bit and a modulation and coding scheme value.

In another configuration, the trigger message may include the mandatory time duration for the data frame and the wireless device 302 may be associated with a space-time block code value and a padding bit. The encoder component 324 may be configured to determine a second number of data symbols for transmitting the data payload based on the mandatory time duration for the data frame. The encoder component 324 may be configured to determine the number of data symbols for transmitting the data payload based a difference between the determined second number of data symbols and a product of the space-time block code value and the padding bit. The data symbols may be padded to fill the determined number of data symbols for transmitting the data payload and may include a third number of data symbols determined based on the product of the space-time block code value and the padding bit. The signal field may include a space-time block code bit, a modulation and coding scheme value, and the padding bit.

In another configuration, the trigger message may include the mandatory time duration for the data frame, the modulation and coding scheme, and the space-time block code bit, and the wireless device 302 may be associated with a space-time block code value determined based on the space-time block code bit. The encoder component 324 may be configured to determine a second number of data symbols for transmitting the data payload based on the mandatory time duration for the data frame. The encoder component 324 may be configured to determine the number of data symbols for transmitting the data payload based on a difference between the determined second number of data symbols and the space-time block code value. The data symbols may be padded to fill the determined number of data symbols for transmitting the data payload and include a third number of data symbols determined based on the space-time block code value.

In another configuration, the trigger message may include the mandatory time duration for the data frame, the modulation and coding scheme, and the space-time block code bit, and the wireless device 302 may be associated with a space-time block code value determined based on the space-time block code bit and associated with a padding bit. The encoder component 324 may be configured to determine a second number of data symbols for transmitting the data payload based on the mandatory time duration for the data frame. The encoder component 324 may be configured to determine the number of data symbols for transmitting the data payload based a difference between the determined second number of data symbols and a product of the space-time block code value and the padding bit. The data symbols may be padded to fill the determined number of data symbols for transmitting the data payload and include a third number of data symbols determined based on the product of the space-time block code value and the padding bit. The signal field may include the padding bit.

In another configuration, the trigger message may include the mandatory time duration for the data frame, the modulation and coding scheme, the space-time block code bit, the padding bit, and the data packet length value. The encoder component 324 may be configured to determine the number of data symbols for transmitting the data payload is based on the mandatory time duration and a difference between the data packet length value and a product of the padding bit and a space-time block code value, the space-time block code value determined based on the space-time block code bit. The data symbols may be padded to fill the determined number of data symbols for transmitting the data payload and include a third number of data symbols determined based on the product of the space-time block code value and the padding bit.

In another configuration, the trigger message may include the mandatory time duration for the data frame, the modulation and coding scheme, the space-time block code bit, the padding bit, a maximum space-time block code value for a plurality of stations, the data packet length value, the data packet length value determined based on a maximum symbol requirement for the plurality of stations and the maximum space-time block code value for the plurality of stations. The encoder component 324 may be configured to determine the number of data symbols for transmitting the data payload is based on the mandatory time duration and a difference between the data packet length value and a product of the padding bit and the maximum space-time block code value. The data symbols may be padded to fill the determined number of data symbols for transmitting the data payload and include a third number of data symbols determined based on the product of the maximum space-time block code value and the padding bit.

In another configuration, the encoder component 324 may be configured to receive a trigger message. The trigger message may include at least one of a mandatory time duration for the data frame, a modulation and coding scheme for the data frame, a space-time block code bit, or a data packet length value, and wherein the data symbols are encoded using BCC encoding. In another configuration, the trigger message may include the mandatory time duration for the data frame and the wireless device 302 may be associated with a space-time block code value. The encoder component 324 may be configured to determine the number of data symbols for transmitting the data payload based on the mandatory time duration. The data symbols may be padded to fill the determined number of data symbols for transmitting the data payload and include a set of tail bits. The signal field may include a space-time block code bit associated with a space-time block code value and a modulation and coding scheme. In another configuration, the trigger message may include the mandatory time duration for the data frame, the modulation and coding scheme, and the space-time block code bit, and the wireless device 302 may be associated with a space-time block code value determined based on the space-time block code bit. The encoder component 324 may be configured to determine the number of data symbols for transmitting the data payload is based on the mandatory time duration. The data symbols may be padded to fill the determined number of data symbols for transmitting the data payload and include a set of tail bits. In another configuration, the trigger message may include the mandatory time duration for the data frame, the modulation and coding scheme, the space-time block code bit, and the data packet length value. The determined number of data symbols for transmitting the data payload may be equal to the data packet length value. The data symbols may be padded to fill the determined number of data symbols for transmitting the data payload and include a set of tail bits. In another configuration, the trigger message may include the mandatory time duration for the data frame, the modulation and coding scheme, the space-time block code bit, and the data packet length value, the data packet length value determined based on a maximum symbol requirement for a plurality of stations and a maximum space-time block code value for the plurality of stations. The determined number of data symbols for transmitting the data payload may be equal to the data packet length value. The data symbols may be padded to fill the determined number of data symbols for transmitting the data payload and include a set of tail bits.

The various components of the wireless device 302 may be coupled together by a bus system 326. The bus system 326 may include a data bus, for example, as well as a power bus, a control signal bus, and a status signal bus in addition to the data bus. Components of the wireless device 302 may be coupled together or accept or provide inputs to each other using some other mechanism.

Although a number of separate components are illustrated in FIG. 3, one or more of the components may be combined or commonly implemented. For example, the processor 304 may be used to implement not only the functionality described above with respect to the processor 304, but also to implement the functionality described above with respect to the signal detector 318, the DSP 320, the user interface 322, and/or the encoder component 324. Further, each of the components illustrated in FIG. 3 may be implemented using a plurality of separate elements.

Figure 4:
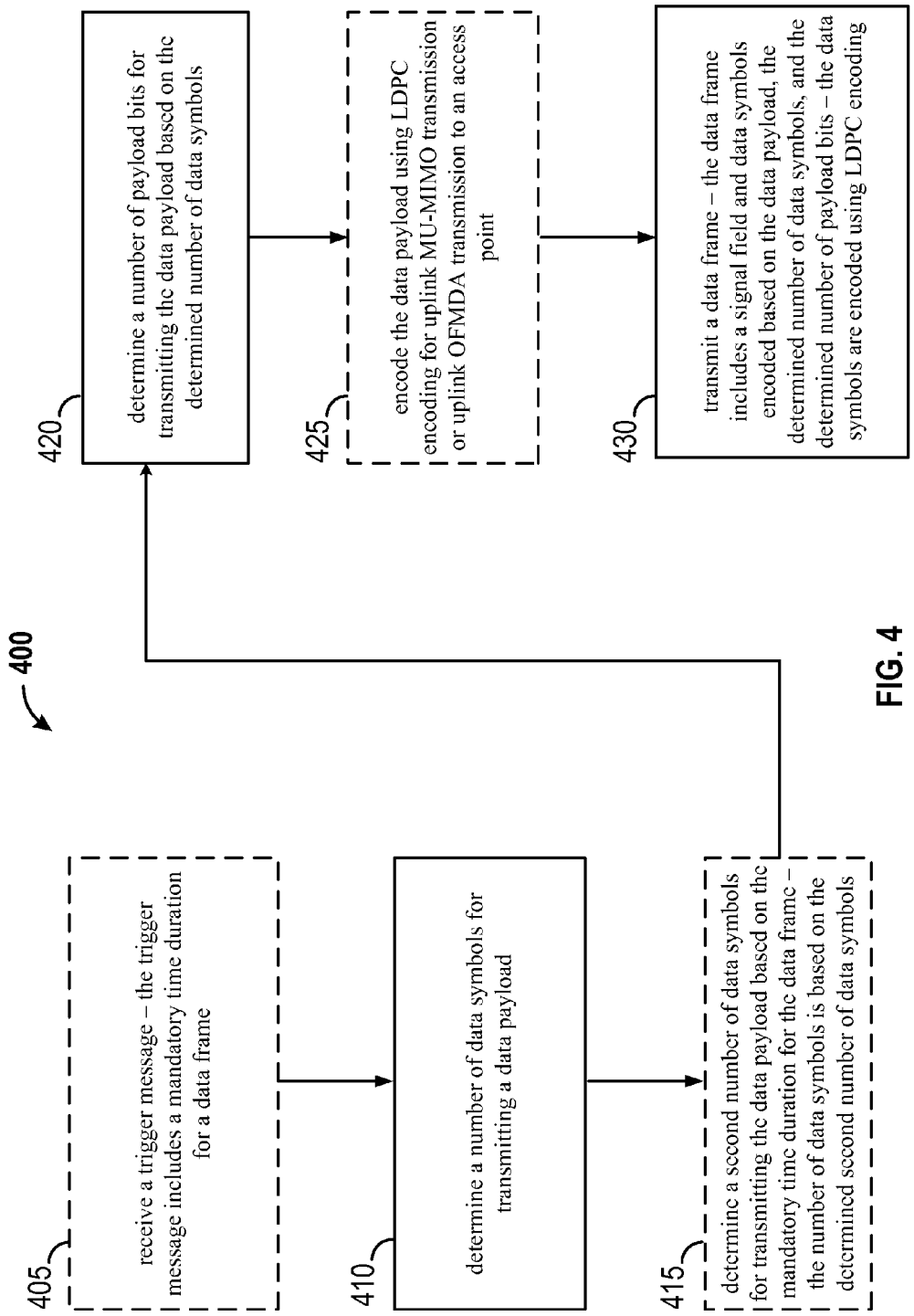
FIG. 4 is a flowchart of an exemplary method of wireless communication using LDPC encoding.

FIG. 4 is a flowchart of an exemplary method 400 of wireless communication using LDPC encoding. The method 400 may be performed using an apparatus (e.g., the STA 114, the STA 212, or the wireless device 302, for example). Although the method 400 is described below with respect to the elements of wireless device 302 of FIG. 3, other components may be used to implement one or more of the steps described herein. In FIG. 4, the blocks indicated with dotted lines represent optional steps.

At block 405, the apparatus may receive a trigger message. The trigger message may include a mandatory time duration for a data frame. For example, referring to FIG. 2, the apparatus may be the STA 212. The STA 212 may receive the trigger message 216 from the AP 202. The trigger message may include a mandatory time duration, $T_{total}$, for the frame 250.

At block 410, the apparatus may determine a number of data symbols for transmitting a data payload. For example, referring to FIG. 2, the STA 212 may determine a number of symbols ($N_{sym\_init,u}$) for transmitting a data payload. In an aspect, at block 415, the apparatus may determine the number of data symbols for transmitting the data payload by determining a second number of data symbols for transmitting the data payload based on the mandatory time duration for the data frame. For example, referring to FIG. 2, the STA 212 may determine $N_{sym\_init,u}$ by determining $N_{sym,u}$. The STA 212 may determine $N_{sym,u}$ by determining the difference $T_{total}-T_{preamble,u}$, and dividing the difference by $T_{sym}$.

At block 420, the apparatus may determine a number of payload bits for transmitting the data payload based on the determined number of data symbols. For example, referring to FIG. 2, the STA 212 may determine a number of payload bits ($N_{pld,u}$) for transmitting the data payload based on the determined number of data symbols ($N_{sym\_init,u}$). In an aspect, the STA 212 may determine $N_{cbps,u}$ and $R_u$. Based on $N_{cbps,u}$ and $R_u$, the STA 212 may determine $N_{pld,u}$.

At block 420, the apparatus may encode the data payload using LDPC encoding for uplink MU-MIMO transmission or uplink OFDMA transmission to an access point. For example, referring to FIG. 2, the STA 212 may encode the data payload using LDPC encoding for uplink MU-MIMO transmission or uplink OFDMA transmission to the AP 202. The STA 212 may encode the data payload by determining the LDPC encoding parameters based on the $N_{sym\_init,u}$ and $N_{pld,u}$. For example, the STA 212 may derive $N_{cw}$, $L_{ldpc}$, $N_{shrt}$, $N_{punc}$, and $N_{rep}$. The STA 212 may encode the data payload based on the determined LDPC encoding parameters.

At block 425, the apparatus may transmit a data frame. The data frame may include a signal field and data symbols encoded based on the data payload, the determined number of data symbols, and the determined number of payload bits. The data symbols may be encoded using LPDC encoding. For example, referring to FIG. 2, the STA 212 may transmit a frame 250 that includes a SIG field 264 and data symbols 268 encoded based on the data payload, the determined number of data symbols, $N_{sym\_init,u}$, and the determined number of payload bits, $N_{pld,u}$.

Figure 5:
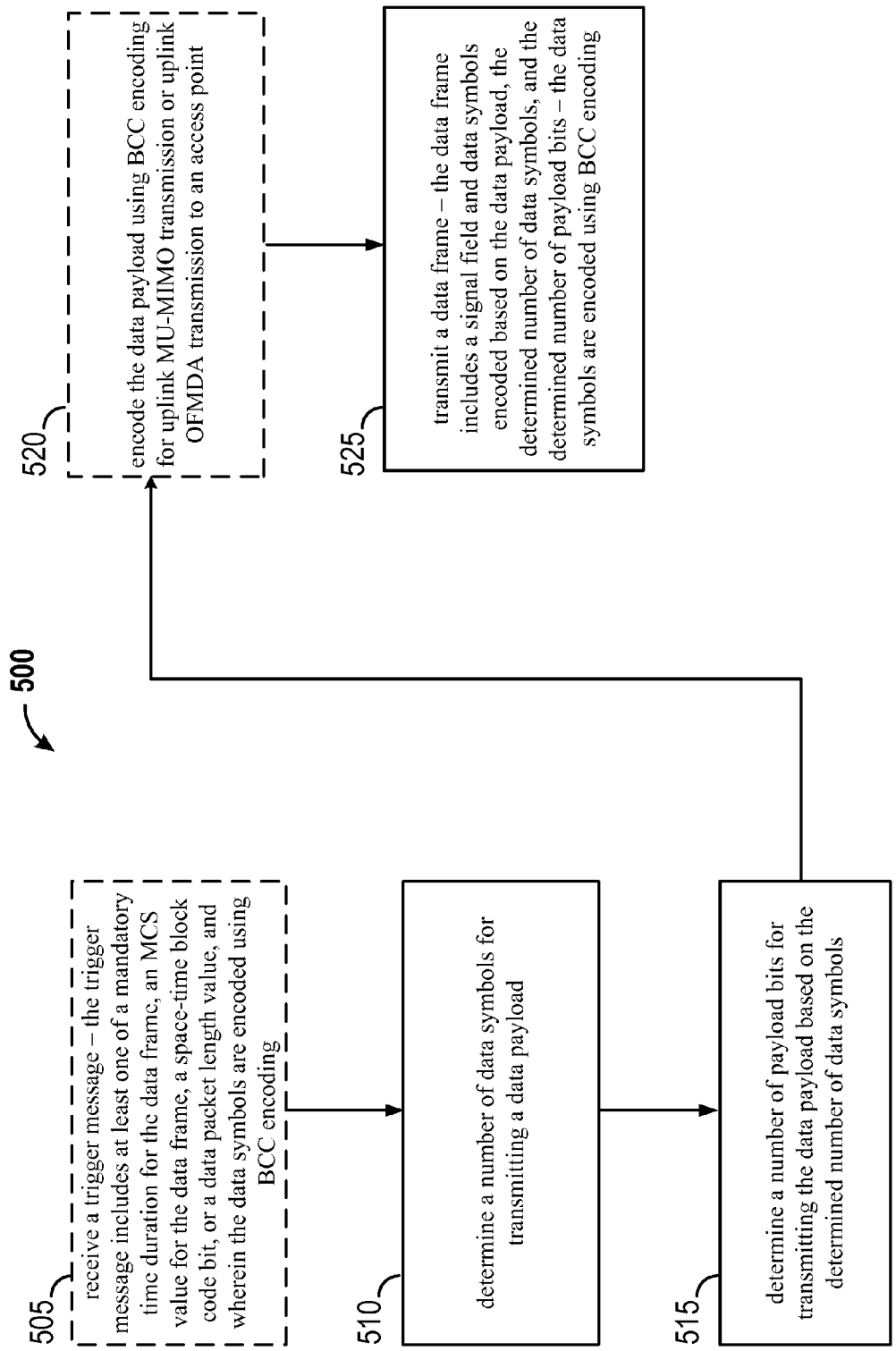
FIG. 5 is a flowchart of an exemplary method of wireless communication using BCC encoding.

FIG. 5 is a flowchart of an exemplary method 500 of wireless communication using BCC encoding. The method 500 may be performed using an apparatus (e.g., the STA 114, the STA 212, or the wireless device 302, for example). Although the method 500 is described below with respect to the elements of wireless device 302 of FIG. 3, other components may be used to implement one or more of the steps described herein. In FIG. 5, the blocks indicated with dotted lines represent optional steps.

At block 505, the apparatus may receive a trigger message. The trigger message may include at least one of a mandatory time duration for the data frame, an MCS value for the data frame, a space-time block code bit, or a data packet length value. For example, referring to FIG. 2, the apparatus may be the STA 212. The STA 212 may receive the trigger message 216 from the AP 202. The trigger message may include a mandatory time duration, $T_{total}$, for the frame 250.

At block 510, the apparatus may determine a number of data symbols for transmitting a data payload. For example, referring to FIG. 2, the STA 212 may determine a number of symbols ($N_{sym,u}$) for transmitting a data payload. In an aspect, the STA 212 may determine $N_{sym,u}$ by determining the difference $T_{total}-T_{preamble,u}$, and dividing the difference by $T_{sym}$. In another aspect, if the trigger message 216 indicates a data packet length value, the STA 212 may determine $N_{sym,u}$ is equal to the data packet length value.

At block 515, the apparatus may determine a number of payload bits for transmitting the data payload based on the determined number of data symbols. For example, referring to FIG. 2, the STA 212 may determine a number of payload bits ($N_{pld,u}$) for transmitting the data payload based on the determined number of data symbols ($N_{sym\_init,u}$). In an aspect, the STA 212 may determine $N_{cbps,u}$ and $R_u$. Based on $N_{cbps,u}$ and $R_u$, the STA 212 may determine $N_{pld,u}$.

At block 520, the apparatus may encode the data payload using BCC encoding for uplink MU-MIMO transmission or uplink OFDMA transmission to an access point. For example, referring to FIG. 2, the STA 212 may encode the data payload using BCC encoding for uplink MU-MIMO transmission or uplink OFDMA transmission to the AP 202. The STA 212 may encode the data payload by determining the BCC encoding parameters based on the $N_{sym\_init,u}$ and $N_{pld,u}$. The STA 212 may encode the data payload based on the determined BCC encoding parameters.

At block 525, the apparatus may transmit a data frame. The data frame may include a signal field and data symbols encoded based on the data payload, the determined number of data symbols, and the determined number of payload bits. The data symbols may be encoded using BCC encoding. For example, referring to FIG. 2, the STA 212 may transmit a frame 250 that includes a SIG field 264 and data symbols encoded based on the data payload, the determined number of data symbols, $N_{sym}$ (where $N_{sym}=N_{sym\_init}$), and the determined number of payload bits, $N_{pld}$.

Figure 6:
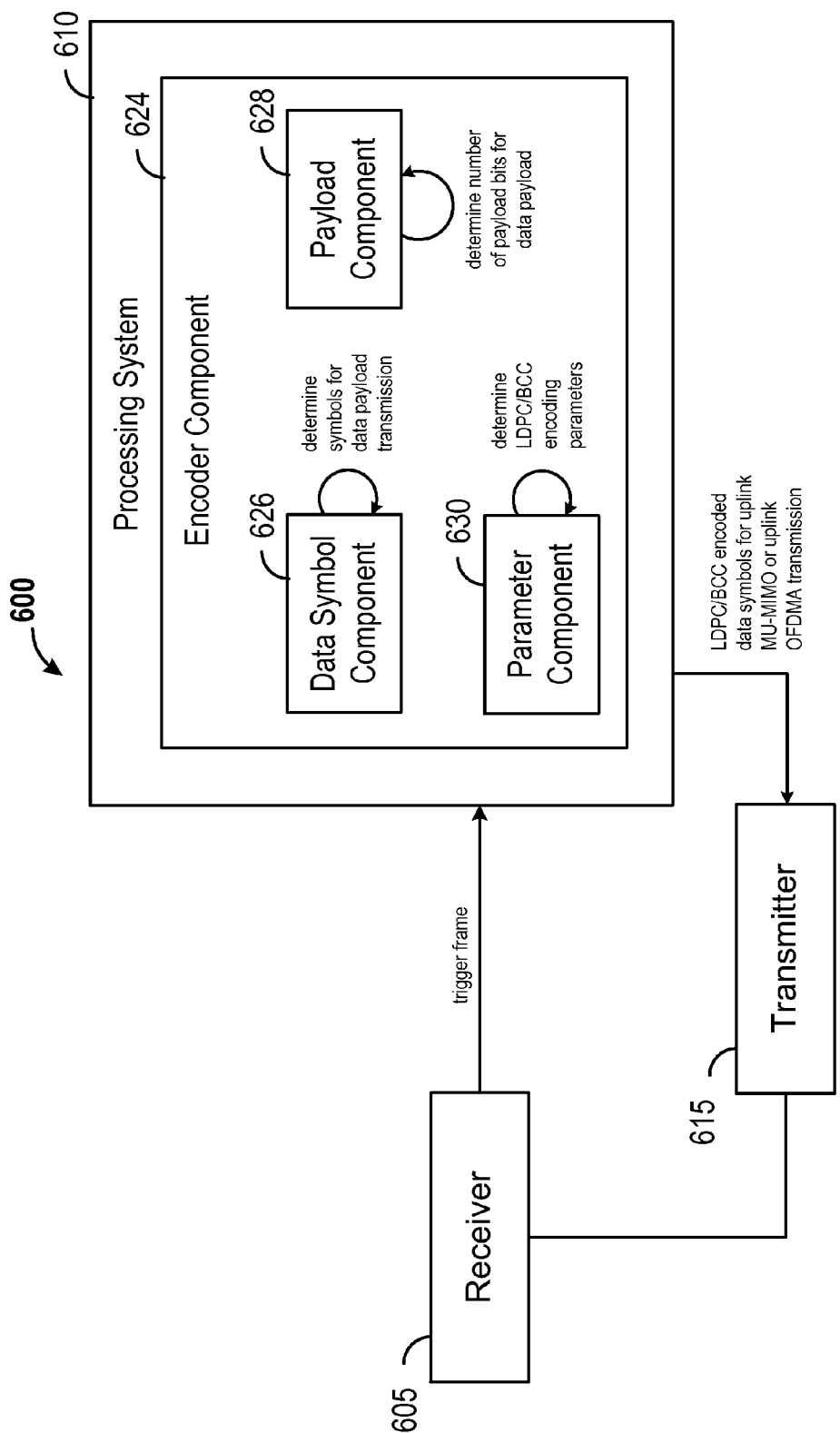
FIG. 6 is a functional block diagram of an exemplary wireless communication device for transmitting LDPC or BCC encoded data symbols.

FIG. 6 is a functional block diagram of an exemplary wireless communication device 600 for transmitting LDPC or BCC encoded data symbols. The wireless communication device 600 may include a receiver 605, a processing system 610, and a transmitter 615. The processing system 610 may include an encoder component 624, and the encoder component 624 may include one or more of a data symbol component 626, a payload component 628, or a parameter component 630. The processing system 610, the encoder component 624, and/or the data symbol component 626 may be configured to determine a number of data symbols for transmitting a data payload. The processing system 610, the encoder component 624, and/or the payload component 628 may be configured to determine a number of payload bits for transmitting the data payload based on the determined number of data symbols. The processing system 610, the encoder component 624, and/or transmitter 615 may be configured to transmit a data frame. The data frame may include a signal field and data symbols encoded based on the data payload, the determined number of data symbols, and the determined number of payload bits, in which the data symbols may be encoded using LDPC encoding or BCC encoding. In an aspect, the signal field may include at least one of a padding bit, a packet length, a space-time block code bit, or a modulation and coding scheme value. In another configuration, the processing system 610, the encoder component 624, and/or the parameter component 630 may be configured to encode the data payload using LDPC encoding or BCC encoding for UL MU-MIMO transmission or UL OFDMA transmission to an access point. In another configuration, the processing system 610, the encoder component 624, and/or the receiver 605 may be configured to receive a trigger message that may include a mandatory time duration for the data frame. In one configuration, the wireless communication device 600 may be associated with a space-time block code value, and the processing system 610, the encoder component 624, and/or the data symbol component 626 may be configured to determine a second number of data symbols for transmitting the data payload based on the mandatory time duration for the data frame. In this configuration, the processing system 610, the encoder component 624, and/or the data symbol component 626 may be configured to determine the number of data symbols for transmitting the data payload based on a difference between the determined second number of data symbols and the space-time block code value. In an aspect, the data symbols may be padded to fill the determined number of data symbols for transmitting the data payload and may include a third number of data symbols determined based on the space-time block code value. In another aspect, the signal field may include a space-time block code bit and a modulation and coding scheme value. In another configuration, the wireless communication device 600 may be associated with a space-time block code value and a padding bit. In this configuration, the processing system 610, the encoder component 624, and/or the data symbol component 626 may be configured to determine a second number of data symbols for transmitting the data payload based on the mandatory time duration for the data frame. The number of data symbols for transmitting the data payload may be determined based a difference between the determined second number of data symbols and a product of the space-time block code value and the padding bit. In an aspect, the data symbols may be padded to fill the determined number of data symbols for transmitting the data payload and may include a third number of data symbols determined based on the product of the space-time block code value and the padding bit. In another aspect, the signal field may include a space-time block code bit, a modulation and coding scheme value, and the padding bit. In another configuration, the processing system 610, the encoder component 624, and/or the receiver 605 may receive a trigger message that includes at least one of a mandatory time duration for the data frame, an MCS value for the data frame, a space-time block code bit, or a data packet length value. In one configuration, the trigger message includes the mandatory time duration for the data frame and the wireless communication device 600 is associated with a space-time block code value. In this configuration, the number of data symbols for transmitting the data payload is based on the mandatory time duration. In an aspect, the data symbols may be padded to fill the determined number of data symbols for transmitting the data payload and include a set of tail bits, and the signal field may include a space-time block code bit associated with the space-time block code value and the MCS value. In another configuration, the trigger message may include the mandatory time duration for the data frame, the MCS value, and the space-time block code bit, and the wireless communication device 600 may be associated with a space-time block code value determined based on the space-time block code bit. In this configuration, the number of data symbols for transmitting the data payload is based on the mandatory time duration, and the data symbols may be padded to fill the determined number of data symbols for transmitting the data payload and may include a set of tail bits. In another configuration, the trigger message may include the mandatory time duration for the data frame, the MCS value, the space-time block code bit, and the data packet length value. In this configuration, the determined number of data symbols for transmitting the data payload is equal to the data packet length value, and the data symbols are padded to fill the determined number of data symbols for transmitting the data payload and include a set of tail bits. In another configuration, the trigger message includes the mandatory time duration for the data frame, the MCS value, the space-time block code bit, and the data packet length value. The data packet length value may be based on a maximum symbol requirement for a plurality of stations and a maximum space-time block code value for the plurality of stations. In this configuration, the determined number of data symbols for transmitting the data payload is equal to the data packet length value, and the data symbols may be padded to fill the determined number of data symbols for transmitting the data payload and may include a set of tail bits.

The receiver 605, the processing system 610, the encoder component 624, and/or the transmitter 615 may be configured to perform one or more functions discussed above with respect to blocks 405, 410, 415, 420, and 425 of FIG. 4 and/or to perform one or more functions discussed above with respect to blocks 505, 510, 515, 520, and 525 of FIG. 5. The receiver 605 may correspond to the receiver 312. The processing system 610 may correspond to the processor 304. The transmitter 615 may correspond to the transmitter 310. The encoder component 624 may correspond to the encoder component 126 and/or the encoder component 324.

In one configuration, the wireless communication device 600 includes means for determining a number of data symbols for transmitting a data payload. The wireless communication device 600 includes means for determining a number of payload bits for transmitting the data payload based on the determined number of data symbols. The wireless communication device 600 includes means for transmitting a data frame. The data frame may include a signal field and data symbols encoded based on the data payload, the determined number of data symbols, and the determined number of payload bits, in which the data symbols are encoded using LDPC encoding or BCC encoding. In an aspect, the signal field includes at least one of a padding bit, a packet length, a space-time block code bit, or a modulation and coding scheme value. In another configuration, the wireless communication device 600 may include means for encoding the data payload using LDPC encoding or BCC encoding for UL MU-MIMO transmission or UL OFDMA transmission to an access point. In another configuration, the wireless communication device 600 may include means for receiving a trigger message that may include a mandatory time duration for the data frame. In another configuration, the wireless communication device 600 is associated with a space-time block code value, and the wireless communication device 600 may include means for determining a second number of data symbols for transmitting the data payload based on the mandatory time duration for the data frame. In this configuration, the number of data symbols for transmitting the data payload is based on a difference between the determined second number of data symbols and the space-time block code value, the data symbols may be padded to fill the determined number of data symbols for transmitting the data payload and may include a third number of data symbols determined based on the space-time block code value. In this configuration, the signal field may include a space-time block code bit and a modulation and coding scheme value. In another configuration, the wireless communication device 600 is associated with a space-time block code value and a padding bit. In this configuration, the wireless communication device 600 may include means for determining a second number of data symbols for transmitting the data payload based on the mandatory time duration for the data frame. The number of data symbols for transmitting the data payload may be based a difference between the determined second number of data symbols and a product of the space-time block code value and the padding bit, and the data symbols may be padded to fill the determined number of data symbols for transmitting the data payload and may include a third number of data symbols determined based on the product of the space-time block code value and the padding bit. In this configuration, the signal field may include a space-time block code bit, a modulation and coding scheme value, and the padding bit. In another configuration, the wireless communication device 600 may include means for receiving a trigger message. The trigger message may include at least one of a mandatory time duration for the data frame, an MCS value for the data frame, a space-time block code bit, or a data packet length value. In this configuration, the trigger message includes the mandatory time duration for the data frame and the wireless communication device 600 is associated with a space-time block code value. In this configuration, the number of data symbols for transmitting the data payload is based on the mandatory time duration, the data symbols are padded to fill the determined number of data symbols for transmitting the data payload and include a set of tail bits, and the signal field may include a space-time block code bit associated with the space-time block code value and the MCS value. In another configuration, the trigger message includes the mandatory time duration for the data frame, the MCS value, and the space-time block code bit, the wireless communication device 600 is associated with a space-time block code value determined based on the space-time block code bit, the number of data symbols for transmitting the data payload is based on the mandatory time duration, and the data symbols are padded to fill the determined number of data symbols for transmitting the data payload and include a set of tail bits. In another configuration, the trigger message includes the mandatory time duration for the data frame, the MCS value, the space-time block code bit, and the data packet length value, the number of data symbols for transmitting the data payload is equal to the data packet length value, and the data symbols are padded to fill the determined number of data symbols for transmitting the data payload and include a set of tail bits. In another configuration, the trigger message includes the mandatory time duration for the data frame, the MCS value, the space-time block code bit, and the data packet length value, the data packet length value being based on a maximum symbol requirement for a plurality of stations and a maximum space-time block code value for the plurality of stations, the determined number of data symbols for transmitting the data payload is equal to the data packet length value, and the data symbols are padded to fill the determined number of data symbols for transmitting the data payload and include a set of tail bits.

For example, means for determining a number of data symbols for transmitting a data payload may comprise the processing system 610, the encoder component 624, and/or the data symbol component 626. Means for determining a number of payload bits for transmitting the data payload based on the determined number of data symbols may comprise the processing system 610, the encoder component 624, and/or the payload component 628. Means for transmitting a data frame may comprise the processing system 610, the encoder component 624, and/or the transmitter 615. Means for encoding the data payload may include the processing system 610, the encoder component 624, and/or the parameter component 630 (which may be configured to determine LDPC and BCC coding parameters). Means for determining a second number of data symbols for transmitting the data payload based on the determined number of data symbols may comprise the processing system 610, the encoder component 624, and/or the data symbol component 626. Means for receiving a trigger message may comprise the processing system 610, the encoder component 624, and/or the receiver 605. Means for determining a maximum number of data symbols based the maximum time duration for the data frame may comprise the processing system 610 and/or the encoder component 624.

Figure 7:
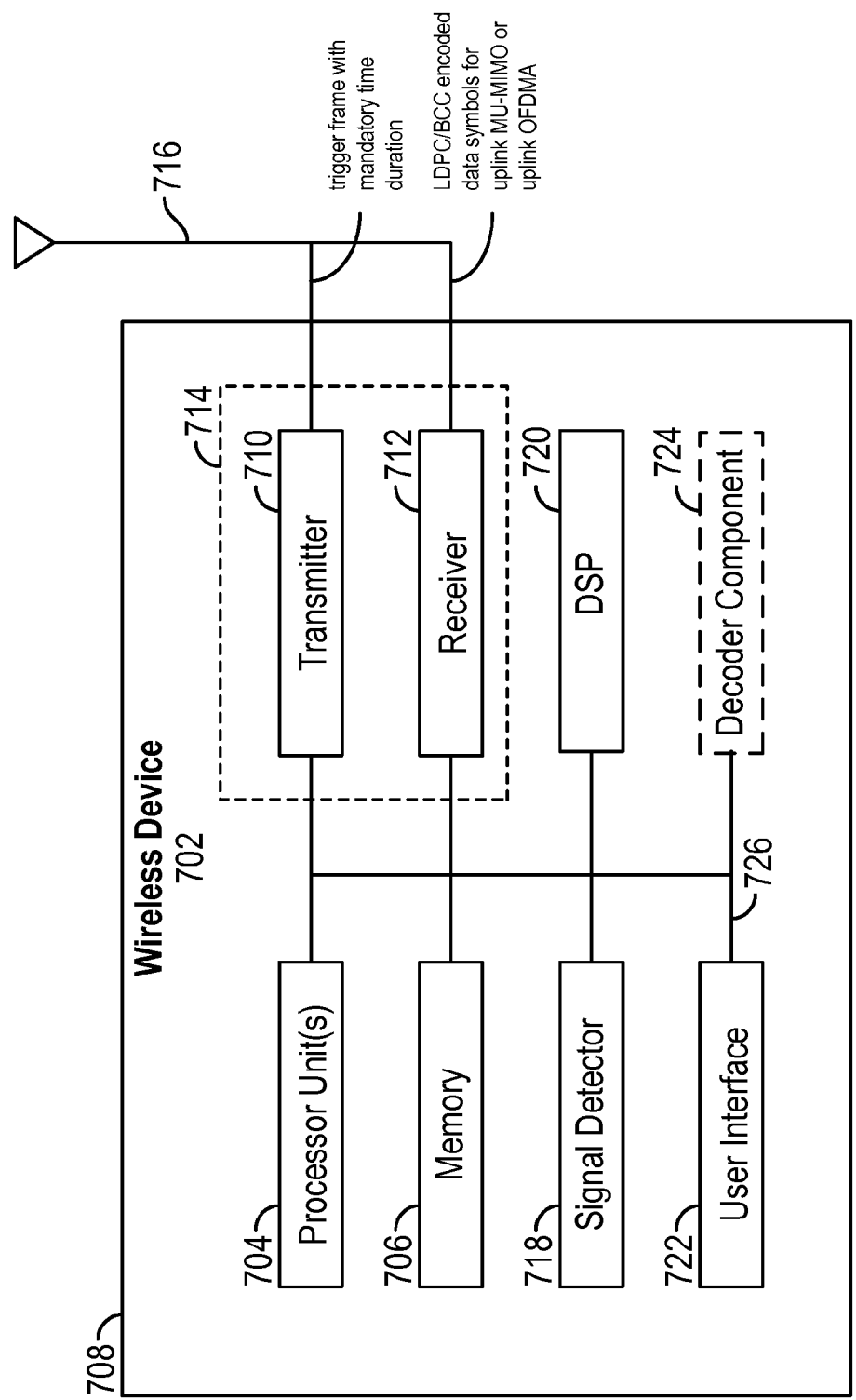
FIG. 7 is a functional block diagram of a wireless device that may be employed within the wireless communication system of FIG. 1 for receiving and decoding LDPC or BCC encoded data symbols.

FIG. 7 is a functional block diagram of a wireless device 702 that may be employed within the wireless communication system 100 of FIG. 1 for receiving and decoding LDPC or BCC encoded data symbols. The wireless device 702 is an example of a device that may be configured to implement the various methods described herein. For example, the wireless device 702 may be the AP 104 or the AP 202.

The wireless device 702 may include a processor 704 which controls operation of the wireless device 702. The processor 704 may also be referred to as a CPU. Memory 706, which may include both ROM and RAM, may provide instructions and data to the processor 704. A portion of the memory 706 may also include NVRAM. The processor 704 typically performs logical and arithmetic operations based on program instructions stored within the memory 706. The instructions in the memory 706 may be executable (by the processor 704, for example) to implement the methods described herein.

The processor 704 may comprise or be a component of a processing system implemented with one or more processors. The one or more processors may be implemented with any combination of general-purpose microprocessors, microcontrollers, DSPs, FPGAs, PLDs, controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein.

The wireless device 702 may also include a housing 708, and the wireless device 702 may include a transmitter 710 and/or a receiver 712 to allow transmission and reception of data between the wireless device 702 and a remote device. The transmitter 710 and the receiver 712 may be combined into a transceiver 714. An antenna 716 may be attached to the housing 708 and electrically coupled to the transceiver 714. The wireless device 702 may also include multiple transmitters, multiple receivers, multiple transceivers, and/or multiple antennas.

The wireless device 702 may also include a signal detector 718 that may be used to detect and quantify the level of signals received by the transceiver 714 or the receiver 712. The signal detector 718 may detect such signals as total energy, energy per subcarrier per symbol, power spectral density, and other signals. The wireless device 702 may also include a DSP 720 for use in processing signals. The DSP 720 may be configured to generate a packet for transmission. In some aspects, the packet may comprise a PPDU.

The wireless device 702 may further comprise a user interface 722 in some aspects. The user interface 722 may comprise a keypad, a microphone, a speaker, and/or a display. The user interface 722 may include any element or component that conveys information to a user of the wireless device 702 and/or receives input from the user.

When the wireless device 702 is implemented as an AP (e.g., the AP 104 or the AP 202), the wireless device 702 may also comprise a decoder component 724. The decoder component 724 may be configured receive a data frame. The data frame may include a signal field and a plurality of data symbols. The decoder component 724 may be configured to determine a number of data symbols in the received data frame and to determine a number of payload bits based on the determined number of data symbols. In one configuration, the decoder component 724 may be configured to determine the number of data symbols in the received data frame based on the signal field. The signal field may include at least one of a padding bit, a data packet length value, a space-time block code bit, or a modulation and coding scheme value. The decoder component 724 may be configured to transmit a trigger message. The trigger message may include at least one of a maximum time duration for the data frame, a mandatory time duration for the data frame, a modulation and coding scheme for the data frame, a space-time block code bit, or a padding bit.

The various components of the wireless device 702 may be coupled together by a bus system 726. The bus system 726 may include a data bus, for example, as well as a power bus, a control signal bus, and a status signal bus in addition to the data bus. Components of the wireless device 702 may be coupled together or accept or provide inputs to each other using some other mechanism.

Although a number of separate components are illustrated in FIG. 7, one or more of the components may be combined or commonly implemented. For example, the processor 704 may be used to implement not only the functionality described above with respect to the processor 704, but also to implement the functionality described above with respect to the signal detector 718, the DSP 720, the user interface 722, and/or the decoder component 724. Further, each of the components illustrated in FIG. 7 may be implemented using a plurality of separate elements.

Figure 8:
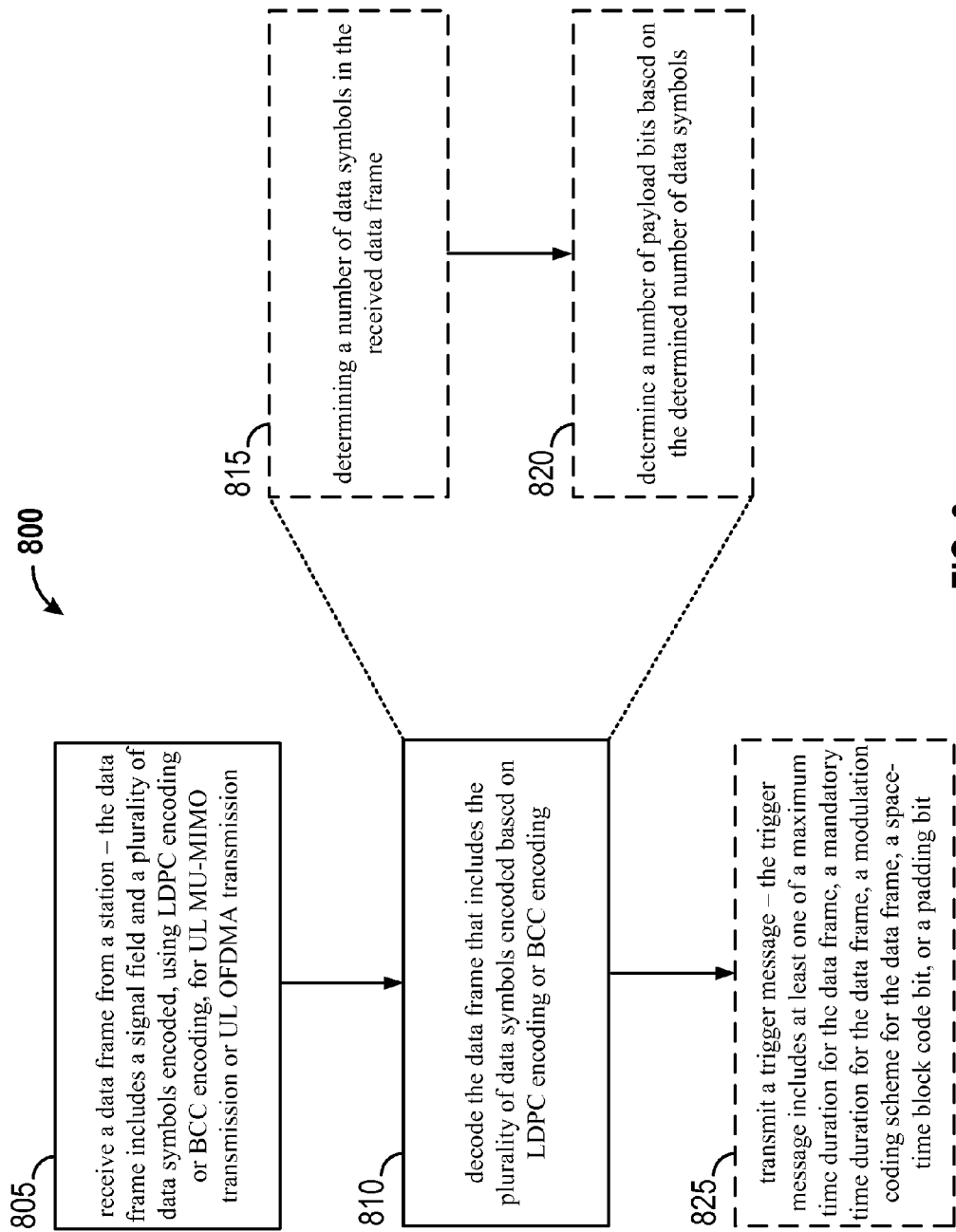
FIG. 8 is a flowchart of an exemplary method of wireless communication for decoding LDPC or BCC encoded packets.

FIG. 8 is a flowchart of an exemplary method 800 of wireless communication for decoding LDPC or BCC encoded packets. The method 800 may be performed using an apparatus (e.g., the AP 104, the AP 202, or the wireless device 602, for example). Although the method 800 is described below with respect to the elements of wireless device 602 of FIG. 6, other components may be used to implement one or more of the steps described herein. In FIG. 8, the blocks indicated with dotted lines represent optional steps.

At block 805, the apparatus receive a data frame from a station. The data frame may include a signal field and a plurality of data symbols encoded, using LDPC encoding or BCC encoding, for UL MU-MIMO transmission or UL OFDMA transmission. For example, referring to FIG. 2, the apparatus may be the AP 202. The AP 202 may receive a frame 250 from the STA 212 in an uplink transmission. The frame 250 may include a SIG field 264 and data symbols 268.

At block 810, the apparatus may decode the data frame that includes the plurality of data symbols encoded based on LDPC encoding or BCC encoding. For example, referring to FIG. 2, the AP 202 may decode the frame 250 that includes the data symbols 268, which may be encoded based on LDPC or BCC encoding. In an aspect, the apparatus may decode the data frame by determining a number of data symbols in the received data frame, at block 815, and by determining a number of payload bits based on the determined number of data symbols, at block 820. For example, the AP 202 may determine a number of data symbols ($N_{sym\_init}$) in the frame 250. For LDPC decoding, the AP 202 may first determine $N_{sym}$, and use $N_{sym}$ to determine $N_{sym\_init}$. In BCC decoding, $N_{sym}$ and $N_{sym\_init}$ have the same value, and therefore, the AP 202 may simply need to determine $N_{sym}$. Subsequently, the AP 202 may determine a number of payload bits ($N_{pld}$) based on the determined number of data symbols ($N_{sym\_init}$ for LDPC or $N_{sym}$ for BCC).

At block 825, the apparatus may transmit a trigger message. The trigger message may include at least one of a maximum time duration for the data frame, a mandatory time duration for the data frame, a modulation and coding scheme for the data frame, a space-time block code bit, or a padding bit. For example, referring to FIG. 2, the AP 202 may transmit a trigger message 216 that includes a mandatory time frame duration from the frame 250, a MCS, a STBC bit, and a padding bit.

Figure 9:
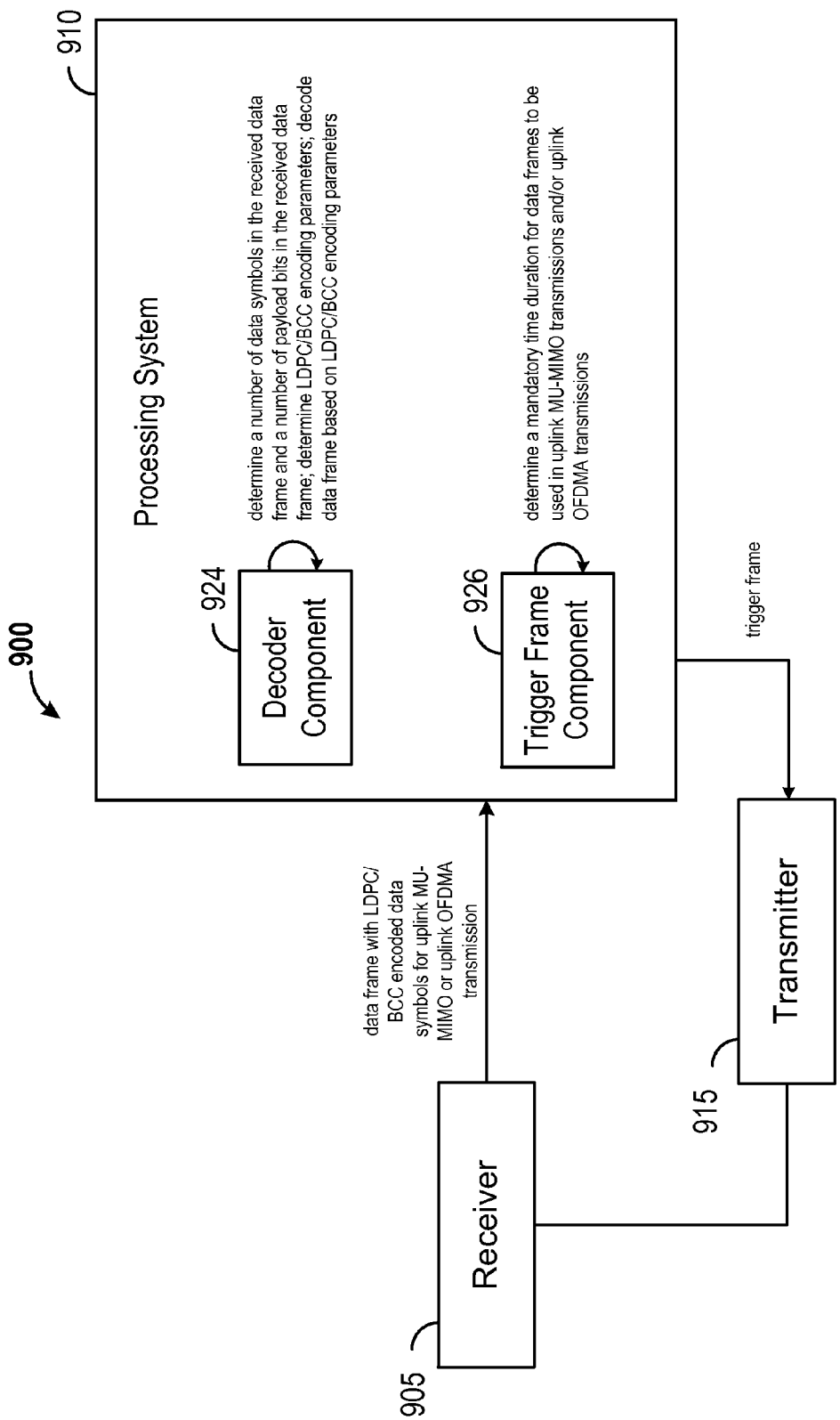
FIG. 9 is a functional block diagram of an exemplary wireless communication device for decoding data symbols.

FIG. 9 is a functional block diagram of an exemplary wireless communication device 900 for decoding data symbols. The wireless communication device 900 may include a receiver 905, a processing system 910, and a transmitter 915. The processing system 910 may include a decoder component 924 and/or a trigger frame component 926. The receiver 905, the processing system 910, and/or the decoder component 924 may be configured to receive a data frame from a station. The data frame may include a signal field and a plurality of data symbols encoded, using LDPC encoding or BCC encoding, for uplink MU-MIMO transmission or uplink OFDMA transmission. The processing system 910 and/or the decoder component 924 may be configured to decode the data frame that includes the plurality of data symbols encoded based on LDPC encoding or BCC encoding. In one configuration, the processing system 910 and/or the decoder component 924 is configured to decode the data frame by determining a number of data symbols in the received data frame and by determining a number of payload bits based on the determined number of data symbols, in which the plurality of data symbols is decoded based on the determined number of data symbols and the determined number of payload bits. In another aspect, the signal field includes at least one of a padding bit, a data packet length value, a space-time block code bit, or an MCS value. In another configuration, the processing system 910, the trigger frame component 926, and/or the transmitter 915 may be configured to transmit a trigger message. The trigger message may include at least one of a mandatory time duration for the data frame, an MCS value for the data frame, a space-time block code bit, or a padding bit.

The receiver 905, the processing system 910, the decoder component 924, the trigger frame component 926, and/or the transmitter 915 may be configured to perform one or more functions discussed above with respect to blocks 805, 810, 815, 820, and 825 of FIG. 8. The receiver 905 may correspond to the receiver 712. The processing system 910 may correspond to the processor 704. The transmitter 915 may correspond to the transmitter 710. The decoder component 924 may correspond to the decoder component 124 and/or the decoder component 724.

In one example, the wireless communication device 900 includes means for receiving a data frame from a station. The data frame includes a signal field and a plurality of data symbols encoded, using LDPC encoding or BCC encoding, for uplink MU-MIMO transmission or uplink OFDMA transmission. The wireless communication device 900 includes means for decoding the data frame that includes the plurality of data symbols encoded based on LDPC encoding or BCC encoding. In one configuration, the means for decoding the data frame is configured to determine a number of data symbols in the received data frame and to determine a number of payload bits based on the determined number of data symbols, in which the plurality of data symbols is decoded based on the determined number of data symbols and the determined number of payload bits. In another aspect, the signal field includes at least one of a padding bit, a data packet length value, a space-time block code bit, or an MCS value. In another configuration, the wireless communication device 900 may include means for transmitting a trigger message, and the trigger message may include at least one of a mandatory time duration for the data frame, an MCS value for the data frame, a space-time block code bit, or a padding bit.

For example, means for receiving a data frame may comprise the processing system 910, the decoder component 924, and/or the receiver 905. Means for decoding may comprise the processing system 910 and/or the decoder component 924. Means for transmitting a trigger message may comprise the processing system 910, the decoder component 924, the trigger frame component 926, and/or the transmitter 915.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, components and circuits described in connection with the present disclosure may be implemented or performed with a general purpose processor, a DSP, an application specific integrated circuit (ASIC), an FPGA or other PLD, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, compact disk (CD)-ROM (CD-ROM) or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes CD, laser disc, optical disc, digital versatile disc (DVD), floppy disk and Blu-ray disc where disks usually reproduce data magnetically, while discs reproduce data optically with lasers. Thus, computer readable medium comprises a non-transitory computer readable medium (e.g., tangible media).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Further, it should be appreciated that components and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a CD or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f), unless the element is expressly recited using the phrase "means for" or, in the case of a method claim, the element is recited using the phrase "step for."

What is claimed is:

1. A method of wireless communication for a station, comprising:
   receiving a trigger message that includes a time duration threshold;
   determining, based on the time duration threshold, a first number of data symbols for transmitting a data payload included in a data frame;
   determining a second number of data symbols for transmitting the data payload included in the data frame, wherein the second number of data symbols is less than the first number of data symbols;
   determining a number of payload bits for transmitting the data payload;
   encoding, using low density parity check (LDPC) encoding or binary convolution code (BCC) encoding, the data payload having the number of payload bits, wherein the encoded data payload includes the second number of data symbols; and
   transmitting the data frame including the encoded data payload, the data frame having a time duration that is less than the time duration threshold included in the received trigger message.

2. The method of claim 1, wherein data frame comprises a signal field comprising at least one of a padding bit, a packet length, a space-time block code bit, or a modulation and coding scheme value.

3. The method of claim 1, wherein encoding the data payload includes encoding the data payload for uplink multi-user multiple-input-multiple-output (MU-MIMO) transmission or uplink orthogonal frequency-division multiple access (OFDMA) transmission to an access point.

4. The method of claim 1 wherein the station is associated with a space-time block code value, wherein determining the second number of data symbols includes determining the second number of data symbols based on the space-time block code value, and wherein the data frame comprises a signal field comprising a space-time block code bit associated with the space-time block code value.

5. The method of claim 1, wherein the station is associated with a space-time block code value and a padding bit, wherein determining the second number of data symbols includes determining the second number of data symbols based on a product of the space-time block code value and the padding bit, and wherein the data frame comprises a signal field comprising a space-time block code bit associated with the space-time block code value and the padding bit.

6. The method of claim 1, wherein encoding the data payload includes encoding the data payload based on a space-time block code value, and wherein the data frame comprises a signal field comprising a space-time block code bit associated with the space-time block code value.

7. The method of claim 1, wherein the trigger message further includes a modulation and coding scheme MCS value and a space-time block code bit, the method further comprising:
determining a space-time block code value associated with the station based on the space-time block code bit included in the trigger message, wherein encoding the data payload includes encoding the data payload based on the space-time block code value.

8. The method of claim 1, wherein the trigger message further includes a data packet length value, wherein the second number of data symbols is equal to the data packet length value included in the trigger message.

9. An apparatus for wireless communication, comprising:
a memory; and
at least one processor coupled to the memory, wherein the at least one processor is configured to:
receive a trigger message that includes a time duration threshold;
determine, based on the time duration threshold, a first number of data symbols for transmitting a data payload included in a data frame;
determine a second number of data symbols for transmitting the data payload included in the data frame, wherein the second number of data symbols is less than the first number of data symbols;
determine a number of payload bits for transmitting the data payload;
encode, using low density parity check (LDPC) encoding or binary convolution code (BCC) encoding, the data payload having the number of payload bits, wherein the encoded data payload includes the second number of data symbols; and
transmit the data frame including the encoded data payload, the data frame having a time duration that is less than the time duration threshold included in the received trigger message.

10. The apparatus of claim 9, wherein data frame comprises a signal field comprising at least one of a padding bit, a packet length, a space-time block code bit, or a modulation and coding scheme value.

11. The apparatus of claim 9, wherein the at least one processor is configured to encode the data payload for uplink multi-user multiple-input-multiple-output (MU-MIMO) transmission or uplink orthogonal frequency-division multiple access (OFDMA) transmission to an access point.

12. The apparatus of claim 9, wherein the apparatus is associated with a space-time block code value, wherein the second number of data symbols is based on the space-time block code value, and wherein the data frame comprises a signal field comprising a space-time block code bit associated with the space-time block code value.

13. The apparatus of claim 9, wherein the apparatus is associated with a space-time block code value and a padding bit, wherein the second number of data symbols is based on a product of the space-time block code value and the padding bit, and wherein the data frame comprises a signal field comprising a space-time block code bit associated with the space-time block code value and the padding bit.

14. The apparatus of claim 9, wherein the at least one processor is configured to encode the data payload based on a space-time block code value, and wherein the data frame comprises a signal field comprising a space-time block code bit associated with the space-time block code value.

15. The apparatus of claim 9, wherein the trigger message further includes a modulation and coding scheme (MCS) value and a space-time block code bit, wherein the at least one processor is further configured to:
determine a space-time block code value associated with the apparatus based on the space-time block code bit included in the trigger message, wherein the at least one processor is configured to encode the data payload based on the space-time block code value.

16. The apparatus of claim 9, wherein the trigger message further includes a data packet length value, wherein the second number of data symbols is equal to the data packet length value included in the trigger message.

* * * * *